United States Patent
Basu et al.

(10) Patent No.: US 12,191,349 B2
(45) Date of Patent: Jan. 7, 2025

(54) REDUCING OFF-STATE LEAKAGE IN SEMICONDUCTOR DEVICES

(71) Applicant: INTEL CORPORATION, Santa Clara, CA (US)

(72) Inventors: Dipanjan Basu, Hillsboro, OR (US);
Cory E. Weber, Hillsboro, OR (US);
Justin R. Weber, Portland, OR (US);
Sean T. Ma, Portland, OR (US);
Harold W. Kennel, Portland, OR (US);
Seung Hoon Sung, Portland, OR (US);
Glenn A. Glass, Portland, OR (US);
Jack T. Kavalieros, Portland, OR (US);
Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 990 days.

(21) Appl. No.: 16/649,287

(22) PCT Filed: Dec. 15, 2017

(86) PCT No.: PCT/US2017/066695
§ 371 (c)(1),
(2) Date: Mar. 20, 2020

(87) PCT Pub. No.: WO2019/117946
PCT Pub. Date: Jun. 20, 2019

(65) Prior Publication Data
US 2020/0279910 A1 Sep. 3, 2020

(51) Int. Cl.
*H01L 29/06* (2006.01)
*H01L 27/088* (2006.01)
(Continued)

(52) U.S. Cl.
CPC ...... *H01L 29/0607* (2013.01); *H01L 27/0886* (2013.01); *H01L 29/0653* (2013.01);
(Continued)

(58) Field of Classification Search
CPC ..... H01L 21/823431; H01L 21/823821; H01L 21/823807; H01L 21/823814;
(Continued)

(56) References Cited

U.S. PATENT DOCUMENTS

2013/0285155 A1* 10/2013 Glass ................ H01L 29/78696
257/369
2014/0065780 A1* 3/2014 Bhuwalka ............. H01L 29/785
438/285
(Continued)

FOREIGN PATENT DOCUMENTS

WO WO-2016105426 A1 * 6/2016 ....... H01L 21/76224
WO WO-2017171845 A1 * 10/2017 ..... H01L 21/823807
WO 2019117946 A1 6/2019

OTHER PUBLICATIONS

International Search Report and Written Opinion received for PCT Application No. PCT/US2017/066695. Date of mailing: Sep. 13, 2018. 11 pages.
(Continued)

*Primary Examiner* — Errol V Fernandes
(74) *Attorney, Agent, or Firm* — Schwabe, Williamson & Wyatt, P.C.

(57) ABSTRACT

Material systems for source region, drain region, and a semiconductor body of transistor devices in which the semiconductor body is electrically insulated from an underlying substrate are selected to reduce or eliminate a band to band tunneling ("BTBT") effect between different energetic bands of the semiconductor body and one or both of the source region and the drain region. This can be accom-
(Continued)

plished by selecting a material for the semiconductor body with a band gap that is larger than a band gap for material(s) selected for the source region and/or drain region.

25 Claims, 10 Drawing Sheets

(51) Int. Cl.
*H01L 29/08* (2006.01)
*H01L 29/161* (2006.01)
*H01L 29/201* (2006.01)
*H01L 29/205* (2006.01)
*H01L 29/423* (2006.01)
*H01L 29/775* (2006.01)
*H01L 29/78* (2006.01)
*H01L 29/786* (2006.01)
*H01L 21/8238* (2006.01)
*H01L 27/092* (2006.01)
*H01L 29/66* (2006.01)

(52) U.S. Cl.
CPC ...... *H01L 29/0673* (2013.01); *H01L 29/0847* (2013.01); *H01L 29/161* (2013.01); *H01L 29/201* (2013.01); *H01L 29/205* (2013.01); *H01L 29/42392* (2013.01); *H01L 29/775* (2013.01); *H01L 29/785* (2013.01); *H01L 29/78618* (2013.01); *H01L 29/78696* (2013.01); *H01L 21/823814* (2013.01); *H01L 27/0924* (2013.01); *H01L 29/66545* (2013.01)

(58) Field of Classification Search
CPC ..... H01L 21/823412; H01L 21/823418; H01L 21/02392; H01L 21/02395; H01L 21/02461; H01L 21/02463; H01L 21/02543; H01L 21/02546; H01L 27/0886; H01L 27/1211; H01L 27/0924; H01L 29/66795; H01L 29/785–7851; H01L 29/42392; H01L 29/0673; H01L 29/78696; H01L 29/66439; H01L 29/775; H01L 29/20; H01L 29/201; H01L 29/205; H01L 29/0856–0865; H01L 29/0873–0882; H01L 29/2006–207; H01L 29/66522

See application file for complete search history.

(56) References Cited

U.S. PATENT DOCUMENTS

| 2015/0206876 | A1 | 7/2015 | Alptekin et al. |
| 2015/0243508 | A1* | 8/2015 | Romero ............. H01L 29/4966 438/681 |
| 2015/0380528 | A1 | 12/2015 | Lee et al. |
| 2016/0322500 | A1 | 11/2016 | Chan et al. |
| 2017/0052618 | A1 | 2/2017 | Lee et al. |
| 2017/0179128 | A1* | 6/2017 | Balakrishnan ............................. H01L 21/823807 |
| 2017/0263706 | A1* | 9/2017 | Gardner ................ H01L 29/775 |
| 2019/0097055 | A1* | 3/2019 | Dewey ............ H01L 21/823878 |

OTHER PUBLICATIONS

International Preliminary Report on Patentability received for PCT Application No. PCT/US2017/066695. Date of Issuance: Jun. 16, 2020. 7 pages.

* cited by examiner

REDUCING OFF-STATE LEAKAGE IN SEMICONDUCTOR DEVICES

CROSS-REFERENCE TO RELATED APPLICATIONS

This patent application is a U.S. National Phase Application under 35 U.S.C. § 371 of International Application No. PCT/US2017/066695, filed on Dec. 15, 2017, the entire contents of which is hereby incorporated by reference herein.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

Band to band tunneling of charge carriers from, for example, a channel region to a drain region of a semiconductor device when the device is biased to an off-state can occur in some configurations of MOSFET devices. For example, when a low voltage is applied to a semiconductor body in an NMOS device and a high voltage is applied to a corresponding drain region, a high gradient electric field can cause charge carries (e.g., electrons in this NMOS example, but more generally majority charge carriers) to tunnel from the valence band of the semiconductor body (in this NMOS semiconductor device example) to the conduction band of the drain region for cases in which the valence band and the conduction band have an overlap in permitted energy levels. This, in turn, can create oppositely charged carriers (e.g., holes in this NMOS example) within the semiconductor body. The band to band tunneling of electrons, in this example, produces an off-state leakage current ("gate induced drain leakage") that degrades performance of the device. The holes generated within the semiconductor body in this example (more generically, minority charge carriers) in response to the tunneling described above can, in some device configurations, flow into an electrically connected substrate or contact. Effectively mitigating such band to band tunneling is non-trivial.

Figure 1A:
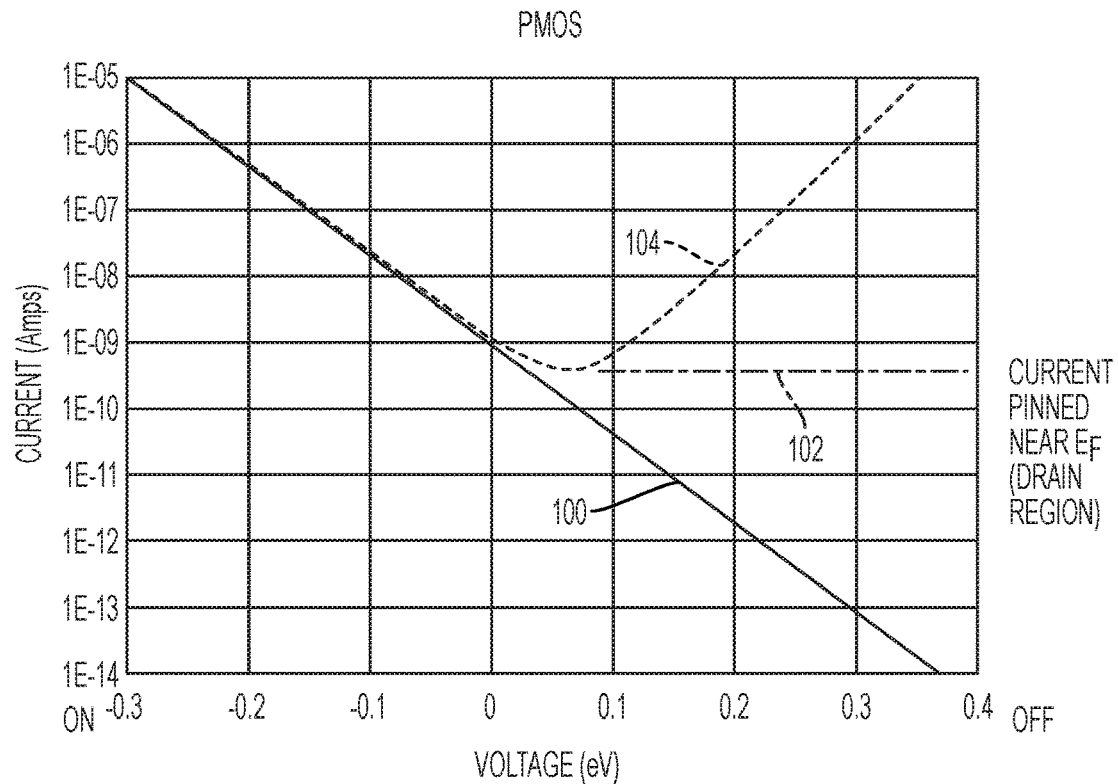
FIG. 1A is a graph of voltage versus current for two different PMOS transistor devices: one PMOS transistor device whose performance is not influenced by the floating body effect and one PMOS transistor device whose operation is being influenced by the floating body effect.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Example embodiments described herein include coordinated selection of materials for source region, drain region, and a semiconductor body (comprising a channel region) of transistor devices in which the semiconductor body is electrically insulated from an underlying substrate. Example configurations of transistor devices in which the semiconductor body is electrically insulated from an underlying substrate include, but are not limited to, nanowire transistors, nanoribbon transistors, semiconductor-on-insulator (SOI or XOI) devices, among others.

Upon coordinated selection of, in some embodiments, source region material, drain region material and semiconductor body material as described herein, a band to band tunneling ("BTBT") effect between different energetic bands of the semiconductor body and one or both of the source region and the drain region is reduced or eliminated. Reduction of the band to band tunneling effect for devices in which the semiconductor body is isolated from the underlying substrate in turn reduces or eliminates a "floating body effect" in which the current used to turn the transistor to an off-state ($I_{OFF}$) is "pinned" at a value that is a function of a Fermi level of the drain region material, according to some embodiments. Reducing this effect, in turn, reduces off-state leakage (more specifically referred to as gate induced drain leakage).

As will be appreciated in light of this disclosure, such beneficial effects can be accomplished by selecting a material for the semiconductor body with a band gap that is larger than a band gap for material(s) selected for the source region and/or drain region. Alternatively, and equivalently, the band gap associated with the source region and drain region materials can be less than the band gap associated with the semiconductor body material. To this end, the band gaps and band energies of the semiconductor body, source region, and drain region can be selected so that an energy band corresponding to the energies of majority charge carriers overlaps between the three regions, and an energy band corresponding to energies of minority charge carriers does not overlap. In one such embodiment, a conduction band of a semiconductor body having a majority charge carrier of electrons has an energetic overlap with conduction bands in the source region and drain region, and does not have an energetic overlap with a valence band of the source region and the drain region in which minority carrier holes are present. These energetic features, either alone or in combination, can prevent band to band tunneling between the semiconductor body and one or more of the source region and the drain region. This can, in turn, reduce or eliminate $I_{OFF}$ pinning and off-state current leakage due to BTBT.

In some example embodiments, the semiconductor body material is selected so as to have a large portion of the band gap on a side of the Fermi level associated with an energy band of the majority charge carrier. This distribution of a band gap relative to the Fermi level within the semiconductor body can help to preserve charge carrier mobility sufficient for device operation within the semiconductor body. Furthermore, a source region material can be selected so as to encourage a high charge carrier velocity as the charge carriers are injected into the semiconductor body, thus delivering a high current (i.e., charge carrier density per unit time and unit of contact area with the semiconductor body). This can reduce some or all of the effects of a lower charge carrier mobility in the semiconductor body that may occur when selecting a semiconductor body material having a large band gap.

General Overview

Figure 1B:
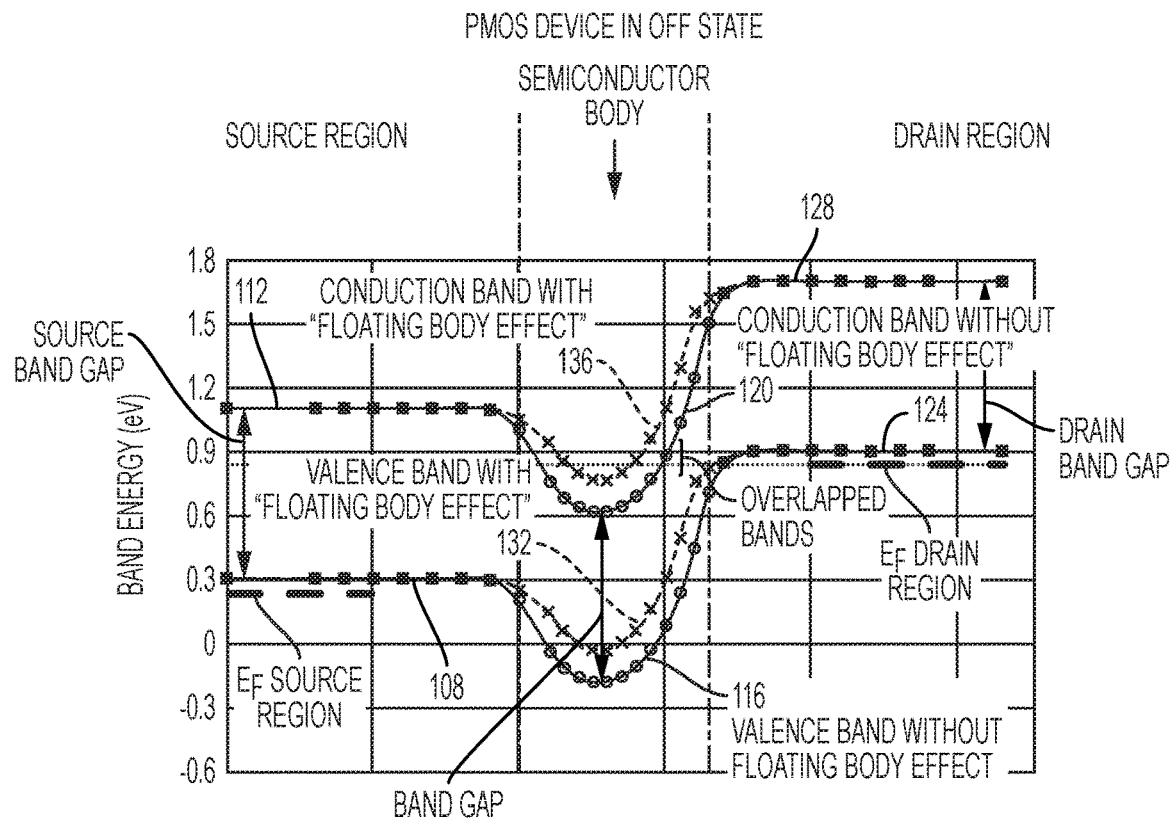
FIG. 1B is a graph of band energy levels for a source region, a drain region, and a semiconductor body therebetween when the energy levels are both affected by and not affected by the floating body effect.

Prior to describing embodiments of the present disclosure, it will be helpful to more deeply understand the underlying issues, as will now be briefly explained in the next four paragraphs and with reference to FIGS. 1A-B.

As previously noted, effectively mitigating band to band tunneling is non-trivial. For example, one possible approach to inhibit the flow of minority charge carriers into the substrate involves transistor configurations in which the semiconductor body is electrically insulated from the substrate (e.g., semiconductor on insulator ("SOI" or "XOI"), nanowire, nanoribbon, among other configurations). As a result of such isolation, however, these minority charge carriers accumulate within the semiconductor body, which gives rise to: (1) an accumulation of holes in the semiconductor body of an NMOS device that reduces the difference in semiconductor body conduction band and valence band energy levels relative to those energy levels in a corresponding drain region; or (2) an accumulation of electrons in a semiconductor body in a PMOS device that reduces the difference in semiconductor body conduction band and valence band energy levels relative to a corresponding drain. In each case, these minority carriers reduce the gate control, making the device harder to bias to an off-state (e.g., little or no current flow through the device). This accumulation of minority charge carriers and the resulting decrease in difference between corresponding energy levels is sometimes referred to as the "floating body effect." The floating body effect (i.e., the accumulation of minority charge carriers when a device is biased to an off-state within a semiconductor body that is insulated from an underlying substrate) refers to an increase in the band energy levels associated with the semiconductor body in a direction toward (and in some cases up to) the Fermi level of the material used in the drain region. For example, in a PMOS device, a conduction band associated with the semiconductor body can rise (or "float") to a Fermi level of the drain region. This causes the current of the device that should be sufficient to bias the device in an off-state, $I_{OFF}$, to become "pinned" at, or near, a current value that is a function of the Fermi level ($E_F$) of the drain region. This pinned value is at a higher current level than usually desired for the off-state of the device, thus increasing the power wasted by the device. The floating body effect is illustrated in various ways in FIGS. 1A and 1B.

Turning first to FIG. 1A, a graph of voltage versus current for biasing a semiconductor to an off-state is shown for three different conditions of a PMOS device. A PMOS transistor device whose performance is not influenced by the floating body effect or band to band tunneling effect is shown as line 100. The line 100 shows a linear relationship between voltage and current flowing through the transistor device. As shown in this example, at a voltage of −0.3 eV the example PMOS transistor device is biased on with a current flow of $1\times10^{-5}$ Amps. As the voltage is increased, the line 100 progresses linearly to lower and lower currents until the PMOS transistor has a negligible current flow ($1\times10^{-14}$ Amps) in an off-state. This is contrast to an example PMOS transistor that exhibits the "floating body effect" (e.g., having a semiconductor body that is insulated from an underlying substrate), as illustrated by the line 102. In this case, due to the accumulation of charge carriers within the semiconductor body, the $I_{OFF}$ current rises to a level that is a function of the $E_F$ of the drain region. Because electron-hole recombination time is long and the minority charge carrier (electrons in this PMOS example) are trapped within a semiconductor body that is electrically isolated from the substrate, the $I_{OFF}$ becomes pinned at a current value that is a function of the $E_F$, as described above. The line 104 exhibits a semiconductor body that is electrically connected to the substrate, thus allowing minority charge carriers generated in the semiconductor body by the BTBT effect to diffuse out of the semiconductor body. The current through the semiconductor body increases even though the voltage is increased to a level that would, in a different configuration, bias the device to an off-state with negligible current flow (e.g., as shown by the line 100).

FIG. 1B is an alternative schematic illustration of this effect for an example transistor that is electrically insulated from an underlying substrate and that exhibits the "floating body effect." FIG. 1B schematically illustrates various energy levels and band gaps corresponding to a source region, a drain region, and a semiconductor body disposed between the source region and the drain region where the semiconductor body is electrically isolated from an underlying substrate. As will be apparent upon inspection of FIG. 1B, the energy levels of each region of the transistor (e.g., source region, drain region, and semiconductor body disposed between the source region and the drain region) are shown as corresponding to their respective regions in a cross-section taken perpendicular to a gate of the transistor device. As shown in this example PMOS device, the source region comprises a valence band energy level 108 and a conduction band energy level 112. Under conditions in which the "floating body effect" is not observed (e.g., a MOSFET in electrical contact with an underlying substrate), the valence band energy 116 and conduction band energy 120 of the semiconductor body are, proximate to the source region, lower than their corresponding values in the source region but then increase so as to be continuous with energy bands of the drain region. The drain regions comprise a valence band energy 124 and a conduction band energy 128. A valence band energy level 132 and a conduction band energy level 136 for a semiconductor body that does exhibit the "floating body effect" are also illustrated in FIG. 1B. As shown, the valence band energy 132 and the conduction band energy 136 are at higher energies than their analogous valence band energy 116 and conduction band energy 120 for a semiconductor body that does not exhibit the floating body effect. This, as explained above, is because the accumulation of minority charge carriers in a semiconductor body has the effect of raising the energy bands and thus increasing the voltage needed to bias the transistor into an off-state. Furthermore, this rise in band energy values for the valence band energy level 132 and the conduction band energy level 136 of the semiconductor body can cause, as explained above, a decrease in the difference between energy levels of the semiconductor body with those associated with the source region and the drain region.

Other techniques that have been used to overcome the band to band tunneling (BTBT) effect include grading dopant levels in the source region and drain region to change the associated Fermi levels (and thus $I_{OFF}$) to more preferable values, or by introducing a wide band gap heterostructure between the semiconductor body and the drain region to, again, tailor the energy level at which $I_{OFF}$ gets pinned. However, while these techniques can reduce the BTBT effect to some extent, the generation of minority carriers in the semiconductor body still causes $I_{OFF}$ pinning and off-state leakage and floating body effect, as described above. Thus, successfully managing both the band to band tunneling effect and the floating body effect is challenging.

Thus, in accordance with an embodiment of the present disclosure, to overcome the floating body effect, and reduce band to band tunneling so as to dramatically decrease off-state leakage current and thus improve the performance of devices having a semiconductor body electrically insulated from an underlying substrate (among other embodiments), the material used for the semiconductor body is selected to have a large band gap such that there is an overlap in energies (or, in other words, no energy offset) between band energy levels of the source region, drain region, and semiconductor body for the majority charge carrier but that does have an energetic gap with the band of the minority charge carrier in the drain region and the source region. In an embodiment, a wide band gap material is selected for the semiconductor body rather than for either of the source region or the drain region, the latter of which is more common because of the high charge carrier mobilities often exhibited by wide band gap materials. For PFET devices, this configuration prevents band to band tunneling of minority charge carriers (i.e., electrons) in the conduction band while allowing majority charge carrier (i.e., hole) movement in the valence band. For NFET devices, this configuration prevents band to band tunneling of minority charge carriers (i.e., holes) in the valence band while allowing majority charge carrier (i.e., electron) movement in the conduction band. This effectively prevents band to band tunneling between the semiconductor body and the drain region via the conduction band, thus eliminating off-state leakage even for device configurations in which the "floating body effect" is more likely and/or more pronounced (e.g., XOI, nanowire). This can produce as much as a 1000 time decrease in off-state current leakage, in some embodiments.

Methodology and Architecture

It will be appreciated that some embodiments of the present disclosure are applicable to configurations in which a semiconductor body of a transistor device (comprising a channel region) is electrically isolated from an underlying substrate. In some embodiments, the configuration includes an insulator layer (e.g., of a dielectric material such as an oxide, nitride, or carbide) disposed between the semiconductor body and an underlying substrate. As mentioned above, devices having such a configuration include semiconductor-on-insulator ("SOI" or "XOI"), nanowire, and nanoribbon devices. For convenience of illustration and explanation, a fabrication methodology and architecture example comprising a nanowire (or "gate all around" or "GAA") device is presented below. It will be appreciated that is example is not intended to limit the embodiments encompassed herein, but is merely provided to illustrate one example of a semiconductor device having a semiconductor body isolated from an underlying substrate.

FIGS. 2A-L illustrate example integrated circuit (IC) structures resulting from a method configured to form nanowire transistors electrically isolated from an underlying substrate and comprising a semiconductor body material and source region material selected to overcome the "floating body effect," in accordance with some embodiments of the present disclosure. The structures of 2A-L are illustrated in the context of forming nanowire (or nanoribbon or gate-all-around (GAA)) transistors including two nanowires/nanoribbons, for ease of illustration. However, the techniques may be used to form nanowire transistors including any number of nanowires/nanoribbons, such as 1-10, or more, in accordance with some embodiments. As will be apparent in light of this disclosure, in some embodiments, the method includes forming a multilayer fin structure of alternating layers of sacrificial and non-sacrificial material, where the one or more non-sacrificial material layers are intended to be formed into nanowires/nanoribbons by removing the intervening sacrificial material layers via selective etch processing, in accordance with some embodiments. In some embodiments, the nanowires/nanoribbons may only be present in the channel region of the final transistor device, while in other embodiments, some or all of the nanowire/nanoribbon layers may also be present in one or both of the source/drain (S/D) regions, as will be apparent in light of this disclosure. Various example transistor types that can benefit from the techniques described herein include, but are not limited to, field-effect transistors (FETs), metal-oxide-semiconductor FETs (MOSFETs), and tunnel-FETs (TFETs). In addition, the techniques can be used to benefit p-type devices (e.g., PMOS) and/or n-type devices (e.g., NMOS). Further, the techniques may be used to benefit various transistor-based devices, such as quantum devices (few to single electron) or complementary MOS (CMOS) devices/circuits, where either or both of the included p-type and n-type transistors may be formed using the techniques described herein (e.g., comprising material selections that overcome the floating body effect), for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 2A:
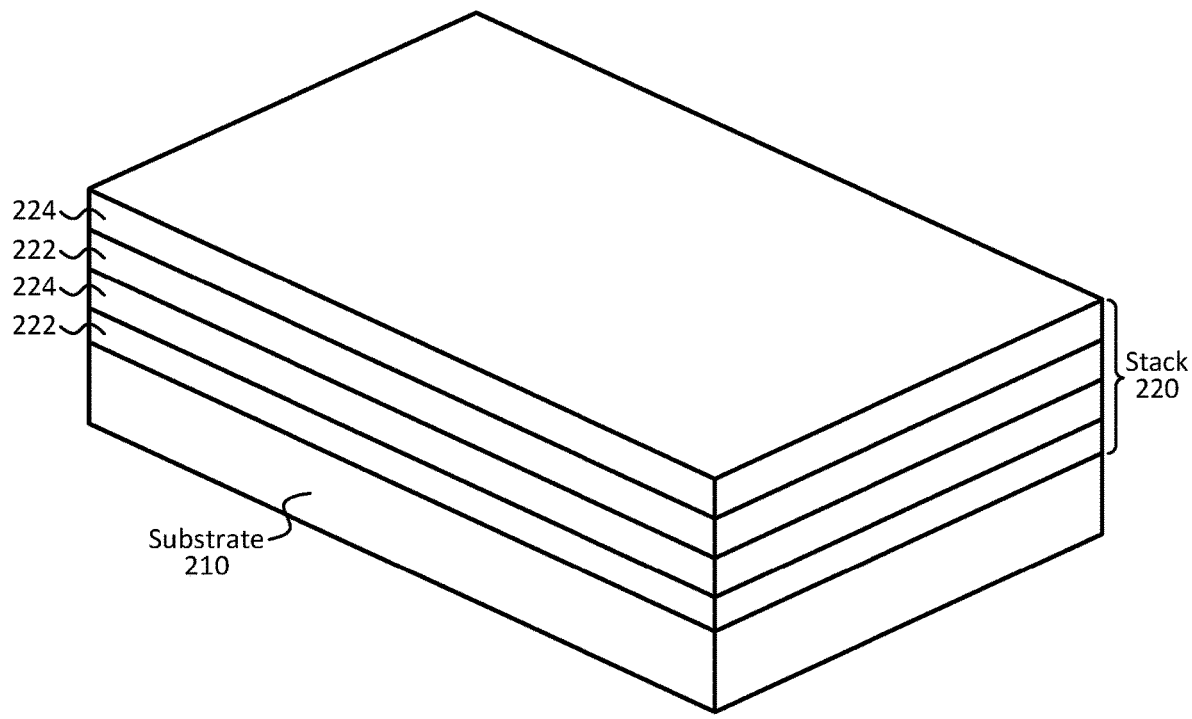
FIGS. 2A-2L illustrate example integrated circuit (IC) structures resulting from a method configured to form nanowire transistors employing carbon-based layers, in accordance with some embodiments of the present disclosure.

FIG. 2A illustrates an example IC structure including substrate 210 with a stack 220 of alternating material layers 222/224 formed thereon, in accordance with an embodiment. In some embodiments, substrate 210 may include: a bulk substrate including group IV semiconductor material, such as silicon (Si), germanium (Ge), or silicon germanium (SiGe), and/or any other suitable semiconductor material(s); an X on insulator (XOI) structure where X includes group IV material (and/or other suitable semiconductor material) and the insulator material is an oxide material or dielectric material or some other electrically insulating material; or some other suitable multilayer structure where the top layer includes group IV material and/or other suitable semiconductor material. Recall that the use of "group IV semiconductor material" (or "group IV material" or generally, "IV") herein includes at least one group IV element (e.g., silicon, germanium, carbon, tin, lead), such as Si, Ge, SiGe, and so forth. Note that group IV may also be known as the carbon group or IUPAC group 14, for example. In some embodiments, substrate 210 may include a surface crystalline orientation described by a Miller Index plane of (001), (011), or (111), for example, as will be apparent in light of this disclosure. Although substrate 210, in this example embodiment, is shown as having a thickness (dimension in the Z-axis direction) similar to layers 222 and 224 for ease of illustration, in some instances, substrate 210 may be much thicker than the other layers, such as having a thickness in the range of 50 to 950 microns, for example, which may be at least 100 times thicker than layers 222 and 224, or any other suitable thickness as will be apparent in light of this disclosure. However, in embodiments where substrate 210 is just the top layer of a multilayer substrate structure (and thus, substrate 210 is essentially a pseudo-substrate), that top layer need not be so thick and may be relatively thinner, such as having a thickness in the range of 20 nm to 10 microns, for example. In some cases, the original thickness of substrate 210 may be reduced as a result of processing in, on and/or above the substrate 210. In some embodiments, substrate 210 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, and/or any other suitable semiconductor or IC devices, depending on the end use or target application. Accordingly, in some embodiments, the transistor structures described herein may be included in a system-on-chip (SoC) application, as will be apparent in light of this disclosure.

In some embodiments, alternating layers 222 and 224 in multilayer stack 220 may be formed using any suitable techniques, such as depositing/growing the layers, one at a time, using molecular-beam epitaxy (MBE), chemical vapor deposition (CVD), atomic layer deposition (ALD), physical vapor deposition (PVD), and/or any other suitable process as will be apparent in light of this disclosure. Recall that multilayer stack 220 is intended to be later formed into nanowires for use in the channel region of one or more transistors, in this example embodiment. Further, in this example embodiment, layers 222 are intended to be sacrificial and layers 224 are intended to be formed into and used for the nanowires/nanoribbons, as will be apparent in light of this disclosure. Therefore, as shown in FIG. 2A, the bottom-most layer of stack 220 is sacrificial layer 222 and the top-most layer is non-sacrificial layer 224. However, the present disclosure is not intended to be so limited. For instance, stack 220 may alternatively have a first-formed/bottom-most layer of non-sacrificial material and/or a last-formed/top-most layer of sacrificial material, in accordance with some embodiments. In an embodiment employing the last-formed/top-most layer as sacrificial material, that sacrificial layer may be formed to protect the top-most non-sacrificial layer in the stack prior to selective etch processing used to form the nanowire(s) in the channel region, for example. In some embodiments, stack 220 may include more than two material layers, such as at least three different material layers, in any desired configuration to achieve a nanowire configuration for use in the channel region of a transistor, as can be understood based on this disclosure. In some such embodiments, the use of at least three different material layers may allow for different spacing between the final nanowires (e.g., via multiple selective etch processes) and/or allow for final nanowires of varying materials in the channel region, for example. As can be understood based on this disclosure, the desired number of nanowires may dictate the number of alternating sacrificial layer 222/non-sacrificial layer 224 sets initially formed (e.g., if 3 nanowires are desired, 3 sets of 222/224 layers may be initially formed, if 5 nanowires are desired, 5 sets of 222/224 layers may be initially formed, and so forth).

In some embodiments, sacrificial layers 222 and non-sacrificial layers 224 may have any suitable thicknesses (dimension in the Z-axis direction), such as thicknesses in the range of 1-100 nm (e.g., 2-10 nm), or any other suitable thickness as will be apparent in light of this disclosure. As can be understood based on this disclosure, the thicknesses of layers 222 and 224 will largely determine the final thicknesses of the one or more nanowires formed in the channel region of a transistor and the spaces therebetween (as well as the space between the bottom-most nanowire and substrate 100). Although layers 222 and 224 are all shown in the example embodiment of FIG. 2A as having the same thicknesses, the present disclosure is not intended to be so limited. For instance, in some embodiments, sacrificial layers 222 may all include similar thicknesses (e.g., plus/minus 1, 2, or 3 nm from their average thickness) and non-sacrificial layers 224 may all include similar thicknesses (e.g., plus/minus 1, 2, or 3 nm from their average thickness), but sacrificial layers 222 and non-sacrificial layers 224 may include different relative thicknesses, such that sacrificial layers 222 are thicker or thinner relative to non-sacrificial layers 224 (e.g., relatively at least 1, 2, 3, 4, 5, 6, 7, 8, 9, or 10 nm thicker or thinner, or some other suitable minimum threshold relative difference).

In some such embodiments, the thickness difference between the sacrificial layers 222 and non-sacrificial layers 224 may be employed to achieve a desired end configuration, including desired nanowire thicknesses and desired spacing distance between nanowires, for example. In some embodiments, sacrificial layers 222 and/or non-sacrificial layers 224 may include varying thicknesses, such that all sacrificial layers 222 need not include relatively similar thicknesses (e.g., two sacrificial layers 222 may have relative thickness differences of greater than 1, 2, 3, 4, or 5 nm) and/or all non-sacrificial layers 224 need not include relatively similar thicknesses (e.g., two non-sacrificial layers 224 may have relative thickness differences of greater than 1, 2, 3, 4, or 5 nm). For instance, in some such embodiments, the bottom-most sacrificial layer 222 may be relatively thicker than other sacrificial layers 222 in stack 220 (only one other sacrificial layer, in this example embodiment, but could be multiple other sacrificial layers in other embodiments), to provide an increased buffer between the bottom-most nanowire formed and substrate 210 after the sacrificial material is removed, for example. In some embodiments, the thickness of at least one layer in multilayer stack 220 may be selected such that the thickness of that at least one layer is below the critical thickness of the material of the at least one layer, to help prevent dislocations from forming. In some such embodiments, where the at least one layer may be grown pseudo-morphically (below the critical thickness of the included material beyond which dislocations form), additional material schemes may be utilized, such as employing materials that are lattice mismatched, for example. In some embodiments, it may be desired to form dislocations in at least one layer of multilayer stack 220, such as in the sacrificial layers 222 (e.g., to assist with their subsequent removal during the selective etch processing in the channel region). Numerous different thickness schemes for the sacrificial and non-sacrificial layers in multilayer stack 220 will be apparent in light of this disclosure.

In some embodiments, sacrificial layers 222 may include any suitable material, such as group IV semiconductor material, for example. For instance, in some embodiments, sacrificial layers 222 may include at least one of Si and Ge. In embodiments where SiGe material is included in one or more sacrificial layers of stack 220, any Ge concentration may be used in the SiGe compound, such that the SiGe may be represented as $Si_{1-x}Ge_x$ where $0<x<1$, for instance. In some embodiments, one or both of the sets of layers (sacrificial layers 222 and/or non-sacrificial layers 224) may include dissimilar material within layers in a single set.

Example materials that can, in various embodiments, be included in non-sacrificial layers 224 so as to overcome the floating body effect are described below. For instance, in some embodiments, non-sacrificial layers 224 may include dissimilar material in the set, such as one of the layers including Si and another including Ge, such that nanowires of varying materials in the same transistor can be employed, to provide an example.

In some embodiments, one or more of the layers included in the multilayer stack 220 may include impurity dopants using any suitable doping scheme, such as doping one or more of the layers using suitable n-type dopants and/or doping one or more of the layers using suitable p-type dopants, for example. In some such embodiments, impurity dopants may be introduced via diffusion and/or ion implantation, for example, and/or via any other suitable techniques. However, in some embodiments, the layers in stack 220 need not include doping (e.g., neither of n-type or p-type dopants), such that the material in the layers are intrinsic or end up being only nominally undoped (e.g., with dopant concentrations of less than 1E18 atoms per cubic centimeter or some other maximum threshold dopant concentration). In some such embodiments, it may be desired that the layers in stack 220 (which includes layers to be in the final channel region of the transistor device) be intrinsic for use in a TFET device, as TFET devices generally include a source-channel-drain doping scheme of p-i-n or n-i-p, where 'p' stands for p-type doped material, 'n' stands for n-type material, and 'i' stands for intrinsic material. In some embodiments, one or more of the layers included in multilayer stack 220 (e.g., one or more of the sacrificial layers 222 and/or non-sacrificial layers 224) may include grading (e.g., increasing and/or decreasing) the content of one or more materials in the layer. Further, in some embodiments, one or more of the layers included in multilayer stack 220 may have a multi-layer structure including at least two material layers, depending on the end use or target application. Further still, additional layers may be present in multilayer stack 220, such as one or more isolation layers (e.g., including dielectric/insulating material) that may be employed to help isolate portions of the final nanowire configuration, for example. Numerous different material and layer configurations for multilayer stack 220 will be apparent in light of this disclosure.

Figure 2B:
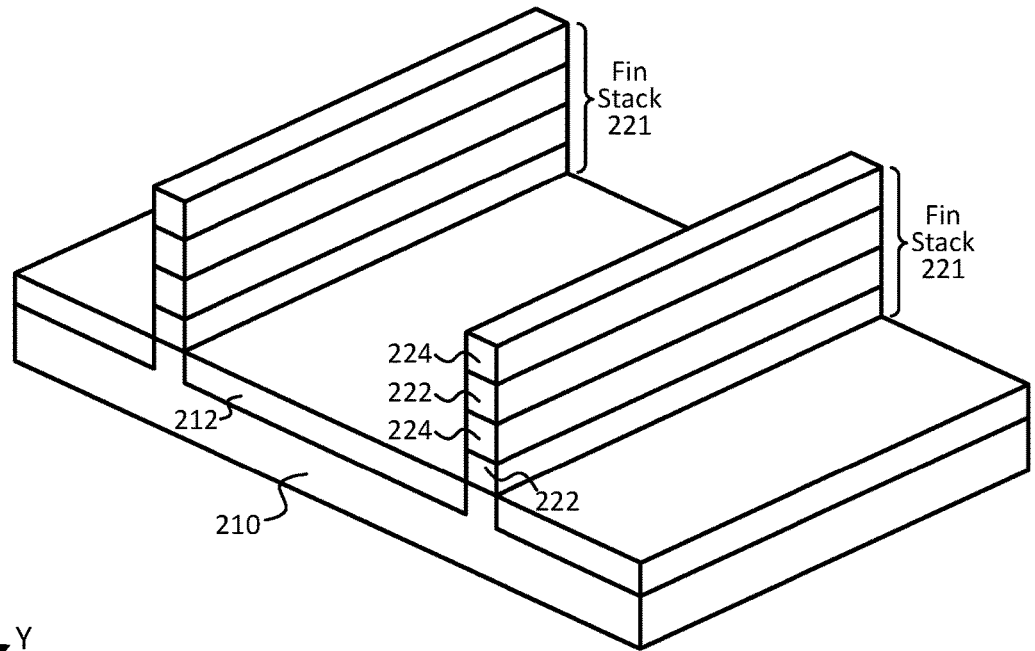

FIG. 2B illustrates an example resulting IC structure after the multilayer stack 220 in the structure of FIG. 2A is formed into one or more fins, in accordance with an embodiment. As shown in this example embodiment, stack 220 was formed into two fin-shaped stacks 221. In some embodiments, any suitable processing may be used to form fins stacks 221, such as patterning (using lithography and etching) stack 220 into the fin stacks 221 shown, for example. Such a patterning process may be similar to a shallow trench recess (STR) process that is employed to form finned (e.g., tri-gate or FinFET) transistors. Any number of lithography and etch processes may to pattern the fin stacks 221, in accordance with some embodiments. Although only two fin stacks 221 are shown in FIG. 2B for ease of illustration, the IC structure may include any number of fin stacks formed from multi-layer stack 220, such as 1-100, hundreds, thousands, millions, or more, as the devices to be formed can be on the nanotechnology scale, as can be understood based on this disclosure. As shown in FIG. 2B, the left and right fin stacks 221 include similar heights (dimension in the Z-axis direction) and widths (dimension in the X-axis direction). However, the present disclosure is not intended to be so limited. For instance, in some embodiments, the fin stacks 221 (when there are multiple fin stacks included) may be formed to have varying heights and/or varying widths. As is also shown in FIG. 2B, the structure includes optional shallow trench isolation (STI) layer 212, which may be formed using any suitable techniques. For instance, STI layer 212, when present, may be formed by etching into substrate 210 to form fins of native material and depositing the STI layer 212 material as shown, in accordance with some embodiments. In other embodiments, STI layer 212 may be deposited between the fin stacks 221 and then recessed, and in some such embodiments, STI layer 212 may be level with at least a portion of the bottom sacrificial layer 222, for example, as opposed to being level with native portions of substrate 210, for instance. However, in some embodiments (e.g., embodiments where substrate 210 is an XOI substrate), STI layer 212 may be absent, as can be understood based on this disclosure. In still other embodiments, the portion of the substrate 210 directly under the fin stacks 221 can be removed via etching so that the STI layer 212 extends under the fin stacks 221 so that an insulation layer is disposed between the substrate 210 and the stacks 221. This preceding example is not limited to nanowire devices, but rather can be applied to FinFET configurations in which the fin is fabricated from a source region material, a drain region material, and a semiconductor body material (comprising a channel region) therebetween.

In some embodiments, fin stacks 221 may be formed using other suitable processing. For instance, in an example embodiment, the fins may be formed by forming fins in substrate 210 (fins native to the substrate), forming STI material between the native fins (and optionally under the native fins), removing at least a portion of the native fins to form fin trenches, and depositing the multilayer stack in the fin trenches, and recessing (or removing) the STI material (e.g., to form fin stacks as shown in FIG. 2B). In such an example embodiment, STI material may be present between the fin stacks (and/or under the fin stacks) and such STI material may include any suitable dielectric, oxide (e.g., silicon dioxide), nitride (e.g., silicon nitride), and or other electrically insulating material, for example. Further, such an example embodiment may employ an aspect ratio trapping (ART) scheme, where the native fins are formed to have a particular height to width ratio (e.g., greater than 1.5, 2, 3, 4, 5, 10, or some other suitable ratio) such that when they are later removed or recessed, the resulting fin trenches formed allow for any defects that may otherwise be present in the replacement multilayer fin stack to terminate on a side surface (e.g., a surface of the STI material) as the material grows vertically. Regardless of the processing used to form fin stacks 221, in some embodiments, STI material may be present between two such fin stacks 121 to provide electrical isolation therebetween, for example. Furthermore, as indicated above, STI material may be disposed between a fin stack 221 and the underlying substrate 210. However, the embodiment shown in FIG. 2B does not include such STI material and thus, it need not be present in some embodiments. Note that although the fin stacks 221 are shown as generally having a rectangular shape with 90 degree angles, such a shape is used for ease of illustration and the present disclosure is not intended to be so limited.

Figure 2C:
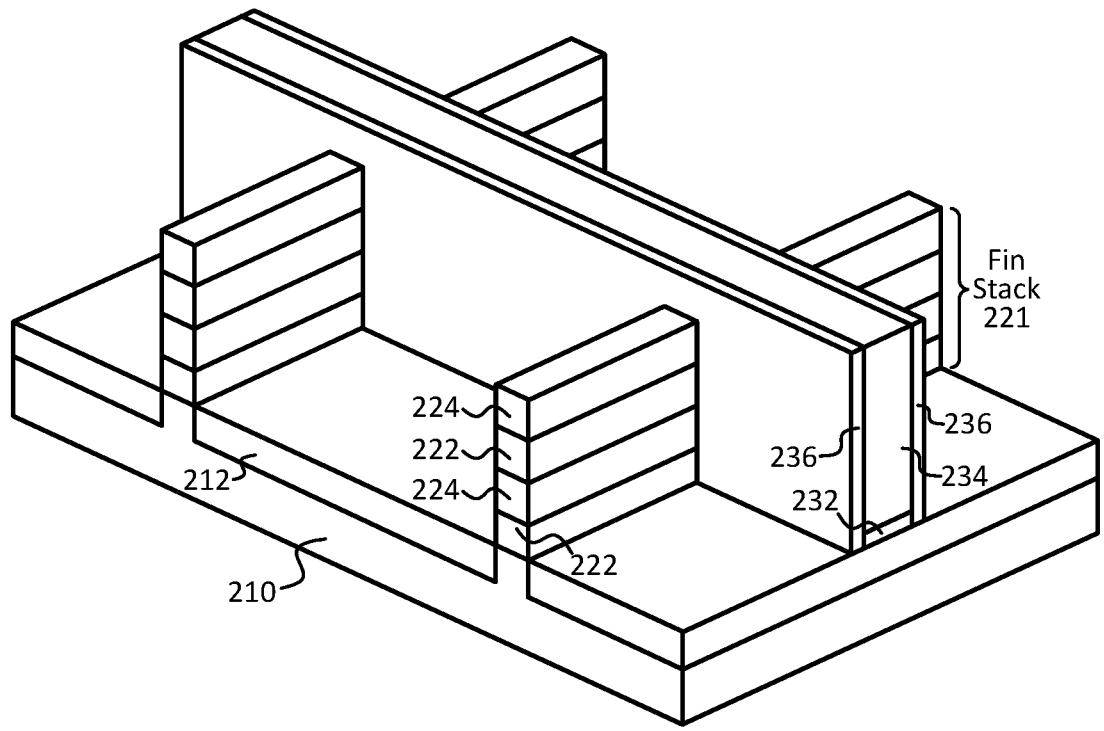

FIG. 2C illustrates an example resulting IC structure after a dummy gate stack is formed on the structure of FIG. 2B, in accordance with an embodiment. In this example embodiment, dummy gate dielectric layer 232 and dummy gate 234 include sacrificial material (e.g., dummy poly-silicon for the gate 234) to be later removed and replaced in a replacement gate process. Such a gate last process flow is utilized in this example embodiment to allow for processing of the channel region into one or more nanowires when the channel region is exposed after removal of the dummy gate stack and prior to the formation of the final gate stack, as will be apparent in light of this disclosure. In some embodiments, formation of the dummy gate stack may be performed using any suitable techniques, such as depositing the dummy gate dielectric layer 232 and dummy gate (also referred to as dummy gate electrode) layer 234, patterning the dummy layers 232 and 234 into a dummy gate stack, depositing gate spacer material, and performing a spacer etch to form spacers 236 on either side of the dummy gate stack, shown in FIG. 2F, for example. Spacers 236 (also referred to as gate spacers or sidewall spacers) can help determine the channel length and can also help with replacement gate processes, for example. As can be understood based on this disclosure, the dummy gate stack (and spacers 236) helps to define the channel region and source/drain (S/D) regions of each fin stack 221, where the nanowires comprising a semiconductor body (and comprising one or more channel regions) is below the dummy gate stack (as it will be located below the final gate stack), and the S/D regions are adjacent to and on either side of the channel region. Spacers 236 may include any suitable material, such as any suitable electrical insulator, dielectric, oxide (e.g., silicon oxide), and/or nitride (e.g., silicon nitride) material, as will be apparent in light of this disclosure. In some embodiments, a hardmask may be formed on dummy gate 234 and/or on spacers 236, which may be included to protect those features during subsequent processing, for example.

Figure 2D:
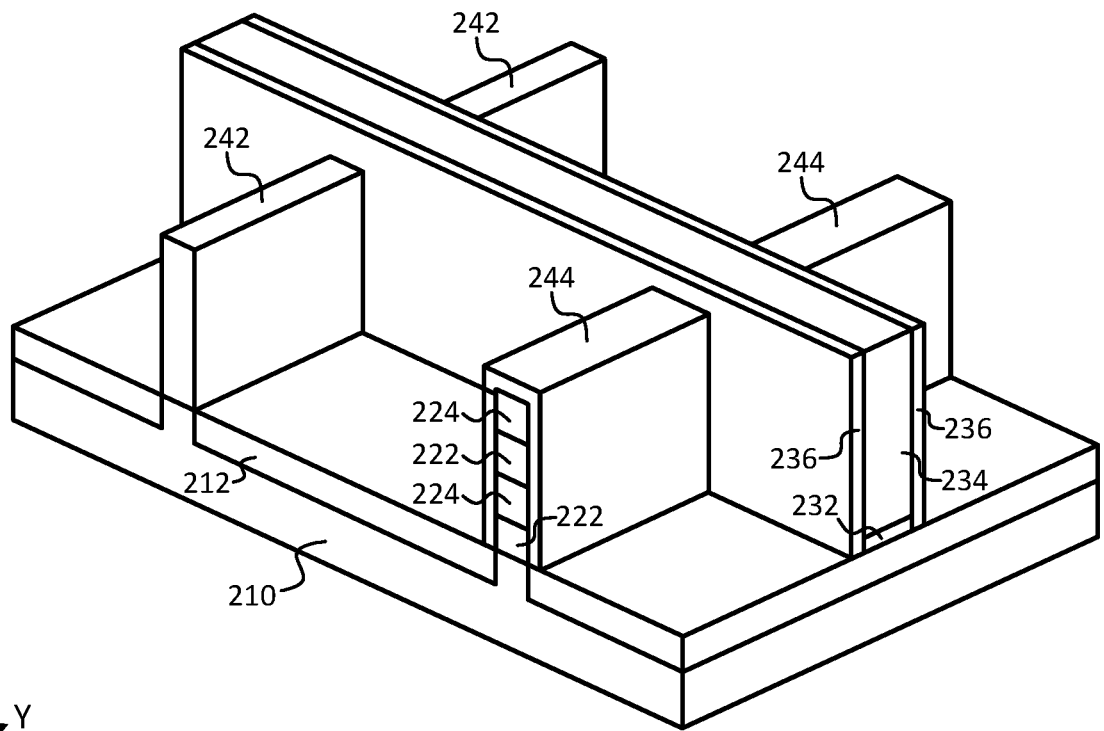

FIG. 2D illustrates an example resulting IC structure after source/drain (S/D) processing has been performed on the structure of FIG. 2C, in accordance with an embodiment. In the example structure of FIG. 2D, different S/D regions have been formed to illustrate different S/D approaches that may be utilized. For instance, for the rear fin stacks, the material in the S/D regions was removed and replaced with replacement material 242, as shown. Note that the rectangular block shape of S/D regions 242 are used for ease of illustration; however, such regrown S/D regions may include other shapes and sizes, as can be understood based on this disclosure. The replacement S/D regions may be formed using any suitable techniques, such as removing at least a portion (or all) of the fin stack 221 and depositing/growing the replacement S/D regions 242. For the forward fin stacks, S/D material 244 was formed over the fin stack in the S/D regions, as shown. Such an overlying S/D feature 244 may be considered a cladding layer, for example. Thus, in such example S/D regions including layer 244, all or a portion of fin stack 221 may remain in the S/D regions, as can be understood based on this disclosure.

Regardless of the S/D scheme employed, the S/D regions may include any suitable material, such as group IV semiconductor material, for example. For instance, both features 242 and 244 may include materials described below that, when selected in cooperation with materials used for the semiconductor body (or bodies in the case of multiple nanowires/nanoribbons) overcome the floating body effect, in accordance with some embodiments. Further, the S/D regions may include any suitable doping scheme compatible with the material selections described below, such that one or both of the S/D regions in a given S/D set may include suitable n-type and/or p-type impurity dopants, depending on the desired configuration. For instance, in the case of fabricating an NMOS device, both of the S/D regions in a given set may include suitable n-type dopants, and in the case of fabricating a PMOS device, both of the S/D regions in a given set may include suitable p-type dopants, in accordance with some embodiments. Recall that in TFET devices, the S/D regions in a given set are generally oppositely type doped, such that one of the S/D regions is n-type doped and the other is p-type doped. In some embodiments, one or both of the S/D regions in a given set may include a multilayer structure of two or more material layers, for example. In some embodiments, one or both of the S/D regions in a given set may include grading (e.g., increasing and/or decreasing) the content/concentration of one or more materials in at least a portion of the region(s). In some embodiments, additional layers may be included in the S/D regions, such as a cap layer used to reduce resistance reduction between the S/D regions and the S/D contacts, for example. Such a cap/resistance reducing layer may include different material than the main S/D material and/or include higher concentration of doping relative to the main S/D material, in accordance with some such embodiments. Note that in some embodiments, S/D processing may be performed after the final gate stack processing has been performed, such as after the processing performed to form the example structure of FIG. 2H, for example.

Figure 2E:
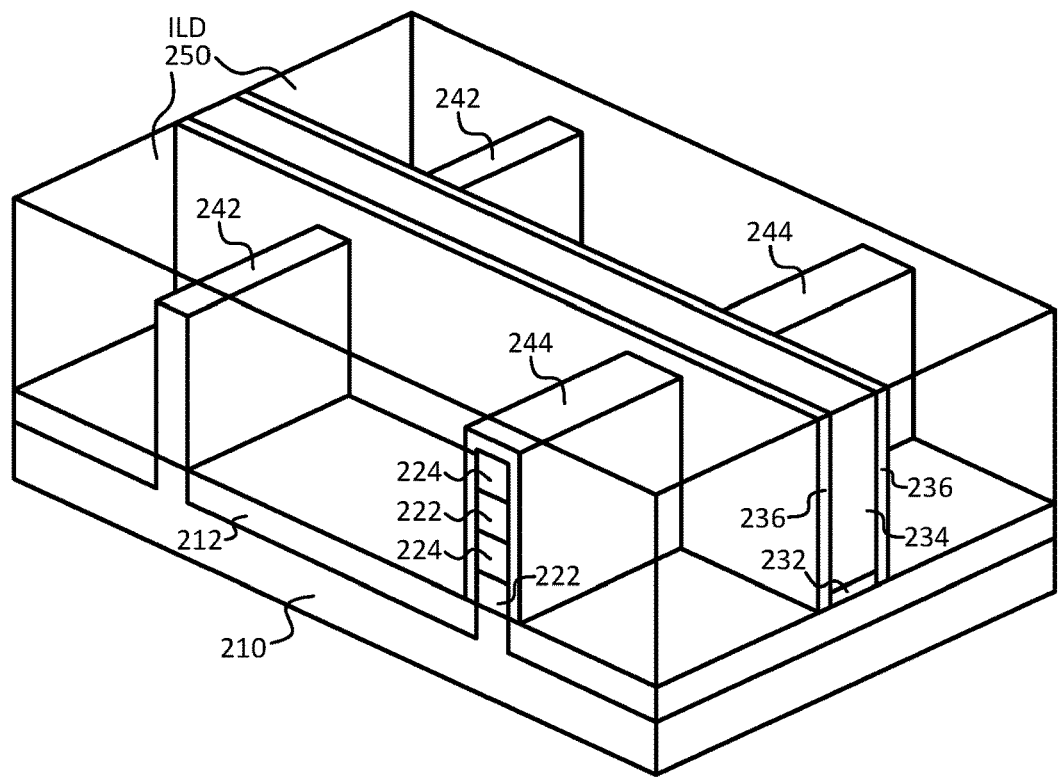

FIG. 2E illustrates an example resulting IC structure formed after a layer of interlayer dielectric (ILD) 250 material has been formed on the structure of FIG. 2D, in accordance with an embodiment. In some embodiments, ILD layer 250 may be formed using any suitable techniques, such as depositing the ILD material and optionally performing a polish/planarization process to form the example structure of FIG. 2E. Note that, in this example embodiment, ILD layer 250 is illustrated as transparent to allow for underlying features to be seen. In some embodiments, the ILD layer 250 may include a dielectric material, such as silicon dioxide or silicon nitride, or some other suitable electrically insulating material, for example.

Figure 2F:
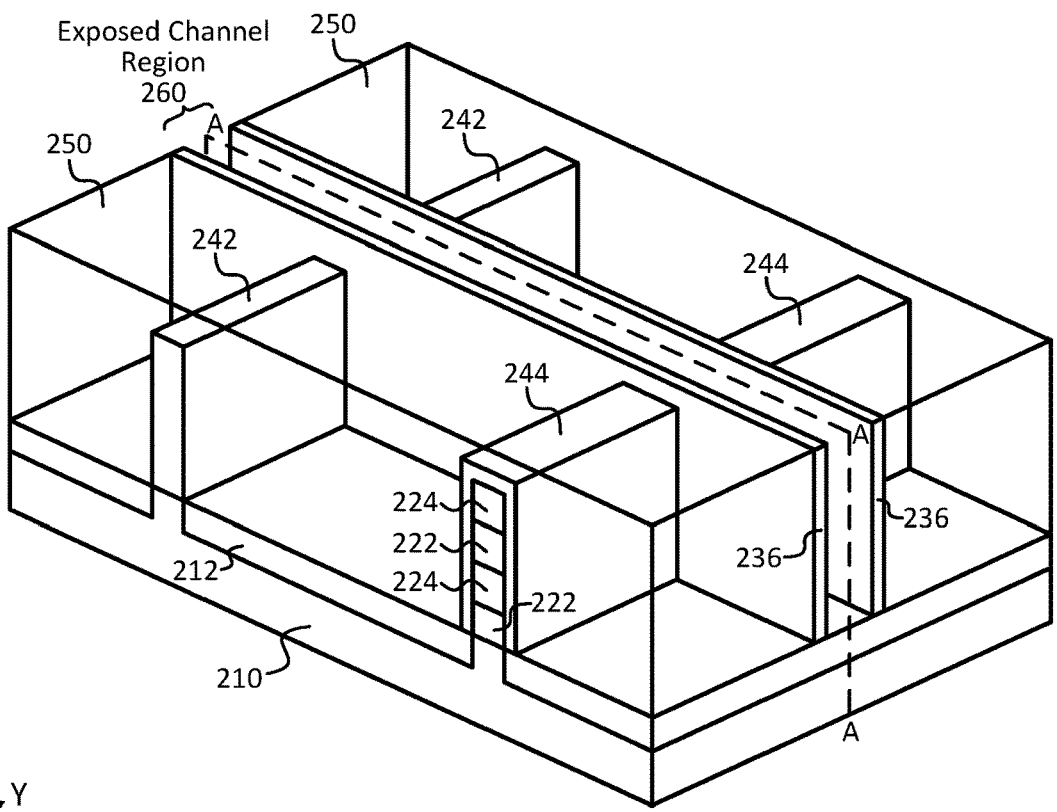

FIG. 2F illustrates an example resulting IC structure formed after the dummy gate stack (including dummy gate dielectric layer 232 and dummy gate 234) of FIG. 2E has been removed to expose the channel region, in accordance with an embodiment. Note that the exposed channel region is indicated as 260 in the figures. In some embodiments, removing the dummy gate stack may include first removing a hardmask layer that is formed on the dummy gate stack (when such a hardmask layer is present), and then removing the dummy gate stack layers 234 and 232 (dummy gate 234 and dummy gate electrode 232, in this example case) using any suitable techniques, such as etches, polishes, and/or cleaning processes, for example. The A plane in FIG. 2F is used to indicate the cross-sectional views of FIGS. 2G-J, as will be described in more detail below.

Figure 2G:
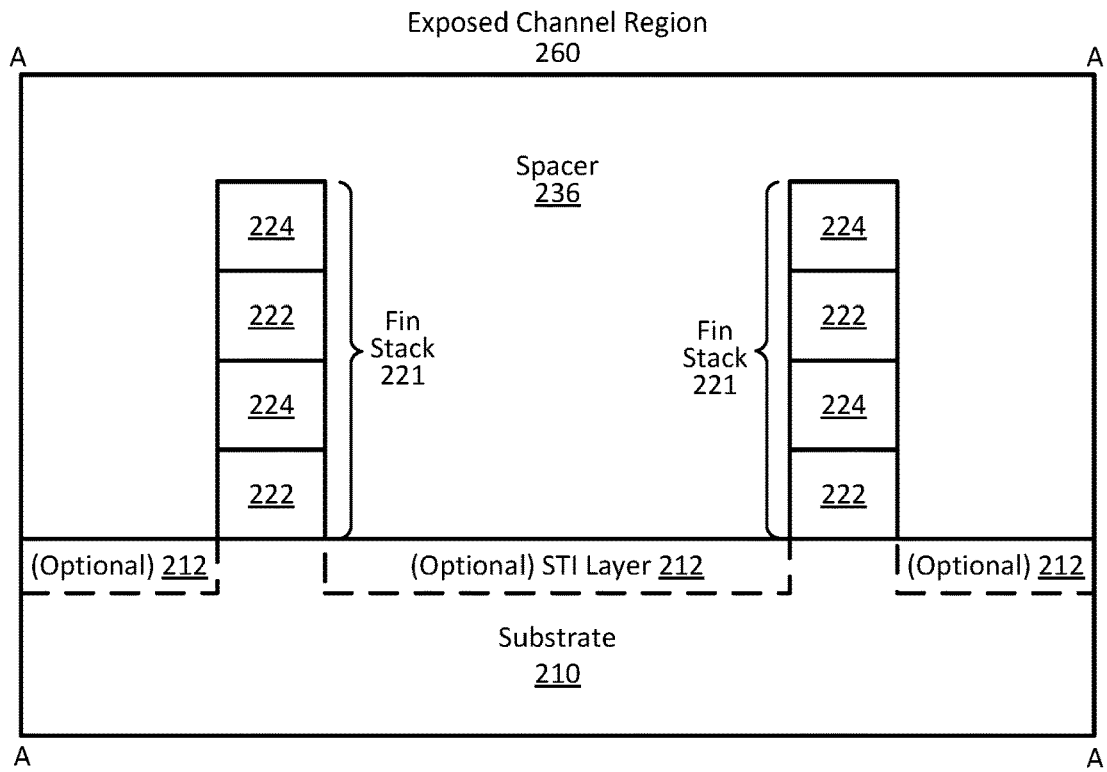

FIGS. 2G-J illustrate cross-sectional views taken along plane A of FIG. 2F, showing example IC structures formed during channel region and gate stack processing, in accordance with some embodiments. As shown in FIG. 2G, the structure includes the same IC structure as that of FIG. 2F, except that a different view is used to assist in illustrating processing that occurs continuing from the structure of FIG. 2H. Therefore, as shown in FIG. 2G, the structure includes the two fin stacks that were previously formed above and on substrate 210, with spacer 236 behind the fin stacks. To assist with the orientation between the structure of FIGS. 2F and 2G, one can refer to the X, Y, and Z-axes that are included for each view. Recall that in some embodiments, STI material may be present between and on the outside of the fin stacks 221 of FIG. 2G, which may help protect substrate 210. For instance, the optional STI layer 212 is shown in FIGS. 2G-2J in dashed lines to illustrate where such an STI layer 212 may be located, when present.

Figure 2H:
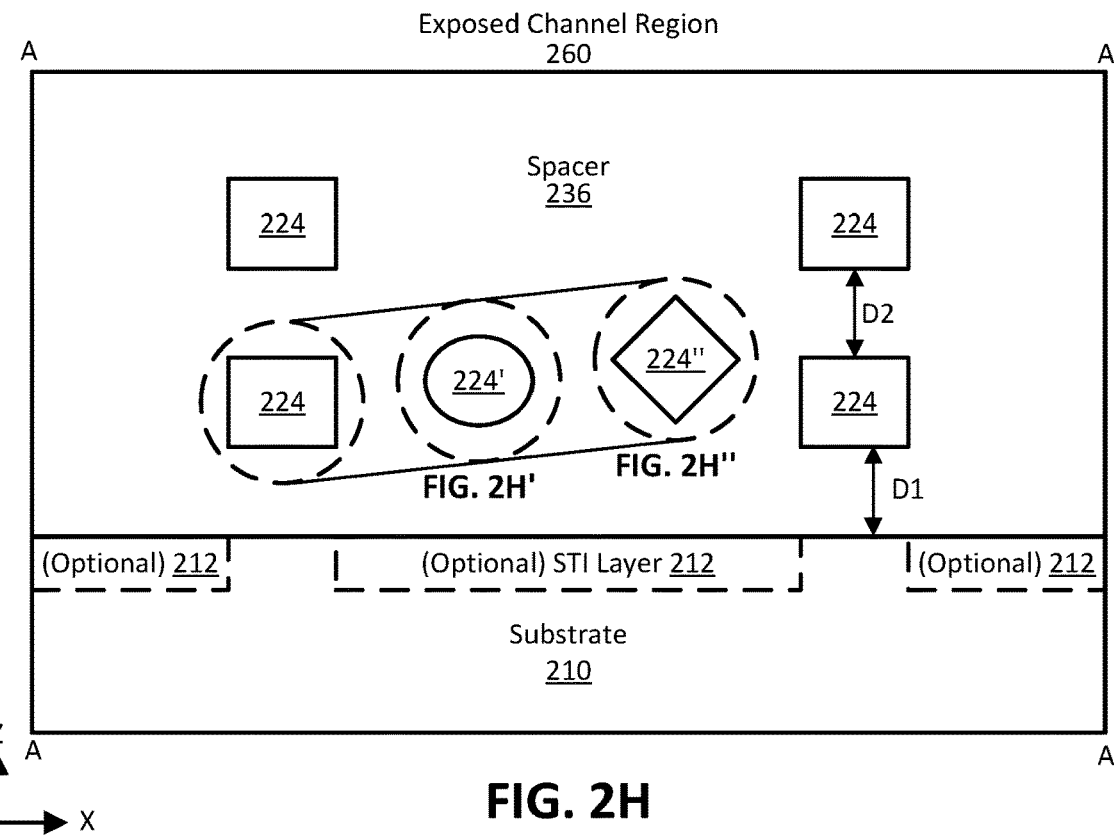

FIG. 2H illustrates an example resulting IC structure after selective etch processing has been performed on the structure of FIG. 2G to remove sacrificial layers 222, in accordance with an embodiment. In some embodiments, the selective etch processing may include one or more selective etches that remove the material of sacrificial layers 222 at a rate of at least 1.5, 2, 3, 4, 5, 10, 50, 100, or 1000 times faster relative to the removal of the material of non-sacrificial layers 224 for a given etchant. In some embodiments, the selective etch processing may not remove any material (or remove a negligible amount of material) from the non-sacrificial layers 224, for example. As can be understood based on this disclosure, the particular etchant used in the selective etch process may be selected based on the material included in sacrificial layers 222 and non-sacrificial layers 224, for example. For instance, a peroxide chemistry may be used to selectively etch and remove the material of sacrificial layers 222 while minimally removing material from (or not removing material at all from) non-sacrificial layers 224. In embodiments where carbon alloy is included in the non-sacrificial layers 224, it may help those layers be more resistant to the selective etch processing, such that relatively less material is removed from the non-sacrificial layers 224 than if those layers 224 did not include carbon alloy, for example. In embodiments where carbon alloy is included in the sacrificial layers 222, it may increase the quantity and/or quality of etchants available for the selective etch processing used to remove those sacrificial layers 222, for example. Therefore, numerous benefits can be realized using the techniques variously described herein.

As can be understood based on FIGS. 2G-2H, the non-sacrificial layers 224 of FIG. 2G became the nanowires 224 of FIG. 2H after sacrificial layers 222 were removed via selective etch processing (only in the exposed channel region 260, as the remainder of the structure of FIG. 2F is covered with ILD layer 250). Thus, when non-sacrificial layers 224 are included in a multilayer fin stack 221, they are referred to as such herein, but once the non-sacrificial layers 224 are converted into nanowires via removal of overlying/underlying sacrificial layers 222, they will be referred to as nanowires 224. Recall that any number of nanowires/nanoribbons may be formed in the channel region of a GAA transistor, in accordance with some embodiments. Therefore, although only two nanowires 224 are formed in the exposed channel region 260 in the example structure of FIG. 2H, the selective etch processing may be used to form 1-10, or more nanowires, for example. In some embodiments, the selective etch processing may not completely remove the sacrificial portion of the multilayer fin stack 221, such that at least a portion of one or more sacrificial layers 222 may still be present in the end structure, for example. Therefore, in some such embodiments, the selective etch processing may be considered to at least partially remove the sacrificial portion of the multilayer fin stack 221, for example. Also note that although the nanowires 224 are depicted as generally having a rectangular shape in the cross-sectional view of FIG. 2H, the present disclosure is not intended to be so limited. For example, in some embodiments, included nanowires may have different cross-sectional geometries, which may more-so resemble a circle, semi-circle, ellipse, semi-ellipse, oval, semi-oval, square, parallelogram, rhombus, trapezoid, diamond, triangle, pentagon, hexagon, and so forth, regardless of orientation. Further, two nanowires included in the same transistor channel region need not have similar cross-sectional geometry, in some embodiments. For instance, the inset views of FIGS. 2H' and 2H" illustrate cross-sectional geometries that generally have an elliptical (nanowire 224') and diamond shape (nanowire 224"), respectively.

In some embodiments, the nanowires 224 formed via the selective etch processing in the channel region 260 may retain their original thickness (dimension in the Z-axis direction). However, in other embodiments, some material may be removed from layers 224 during the selective etch processing. Therefore, in some embodiments, the resulting nanowires 224 may include a maximum thickness (dimension in the Z-axis or vertical direction) in the range of 1-100 nm (e.g., 2-10 nm), or any other suitable maximum thickness as will be apparent in light of this disclosure. Further, in some embodiments, the nanowires within the channel region of a transistor (e.g., the set of nanowires 224 on the left side or the set on the right side, or both) may include nanowires of varying maximum thicknesses, such that two nanowires may have different relative thicknesses (e.g., relative maximum thickness difference of at least 1, 2, 3, 4, 5, or 10 nm). However, in other embodiments, the nanowires within the channel region of a transistor may include nanowires of similar maximum thicknesses, such that each nanowire is within 1, 2, or 3 nm of the average maximum thickness of all of the nanowires in the channel region, or within some other suitable amount as will be apparent in light of this disclosure. The space/distance between nanowires included in a transistor channel region may also vary, in accordance with some embodiments. In some embodiments, the minimum distance between two nanowires in a channel region (e.g., the dimension indicated as distance D in FIG. 2H) may be in the range of 1-50 nm (e.g., 2-10 nm) or some other suitable amount as will be apparent in light of this disclosure. In some embodiments, the minimum distance between two nanowires may be less than a quantity in the range of 2-10 nm, or less than some other suitable maximum threshold amount as will be apparent in light of this disclosure. In some embodiments, the minimum distance (e.g., distance D) that can be achieved between two nanowires formed using the techniques herein employing carbon as variously described may be relatively less compared to techniques of forming similar nanowires without employing carbon. Therefore, as a result of being able to achieve smaller minimum distances (e.g., due to the lack of or reduced diffusion between sacrificial and non-sacrificial layers), more nanowires can be formed in a given channel region height, thereby leading to an improvement in transistor performance, as described herein.

Figure 2I:
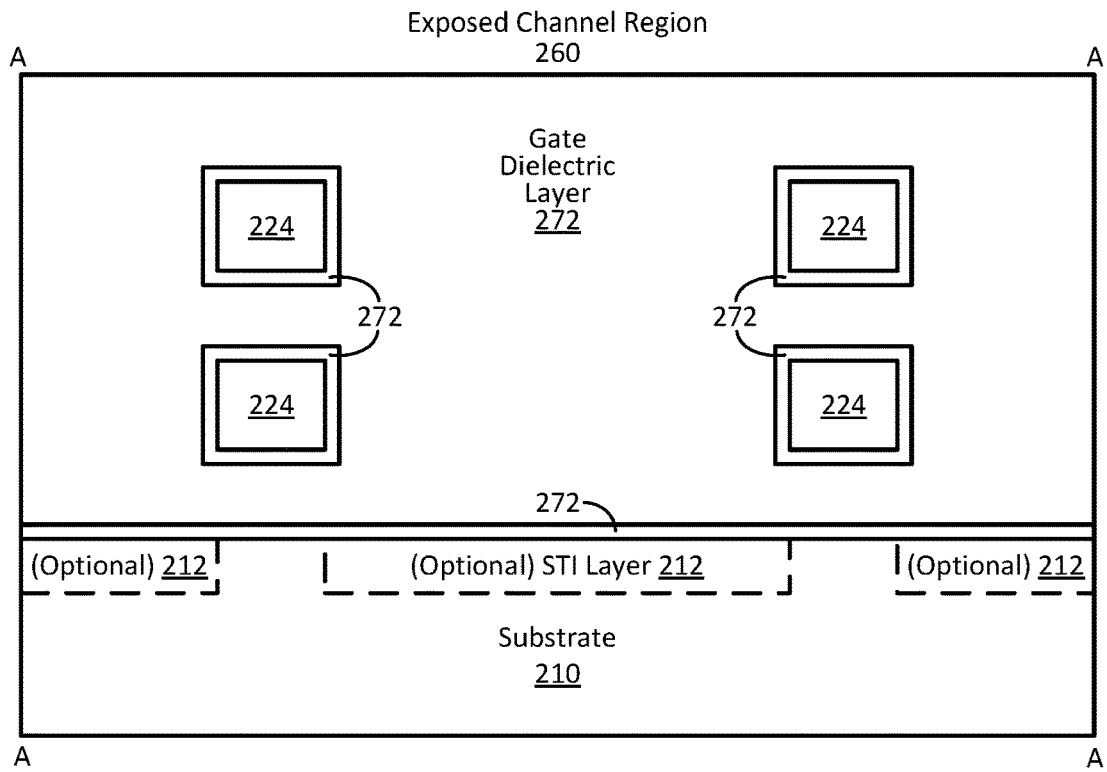

FIG. 2I illustrates an example resulting IC structure after gate dielectric layer 272 has been deposited in the exposed channel region 260 of the structure of FIG. 2H, in accordance with an embodiment. In some embodiments, gate dielectric layer 272 may be formed using any suitable techniques, such as using any suitable deposition process (e.g., MBE, CVD, ALD, PVD), for example. In some embodiments, gate dielectric layer 272 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 272 to improve its quality when a high-k material is used, for example. In some embodiments, gate dielectric layer 272 may be relatively thin, such as having a thickness in the range of 1-20 nm, for example, or some other suitable thickness as will be apparent in light of this disclosure. Note that gate dielectric layer 272 was formed on the bottom of the exposed channel region from the structure of FIG. 2H and also on the exposed sidewalls of spacers 236, as can be understood based on the structure of FIG. 2I.

Figure 2J:
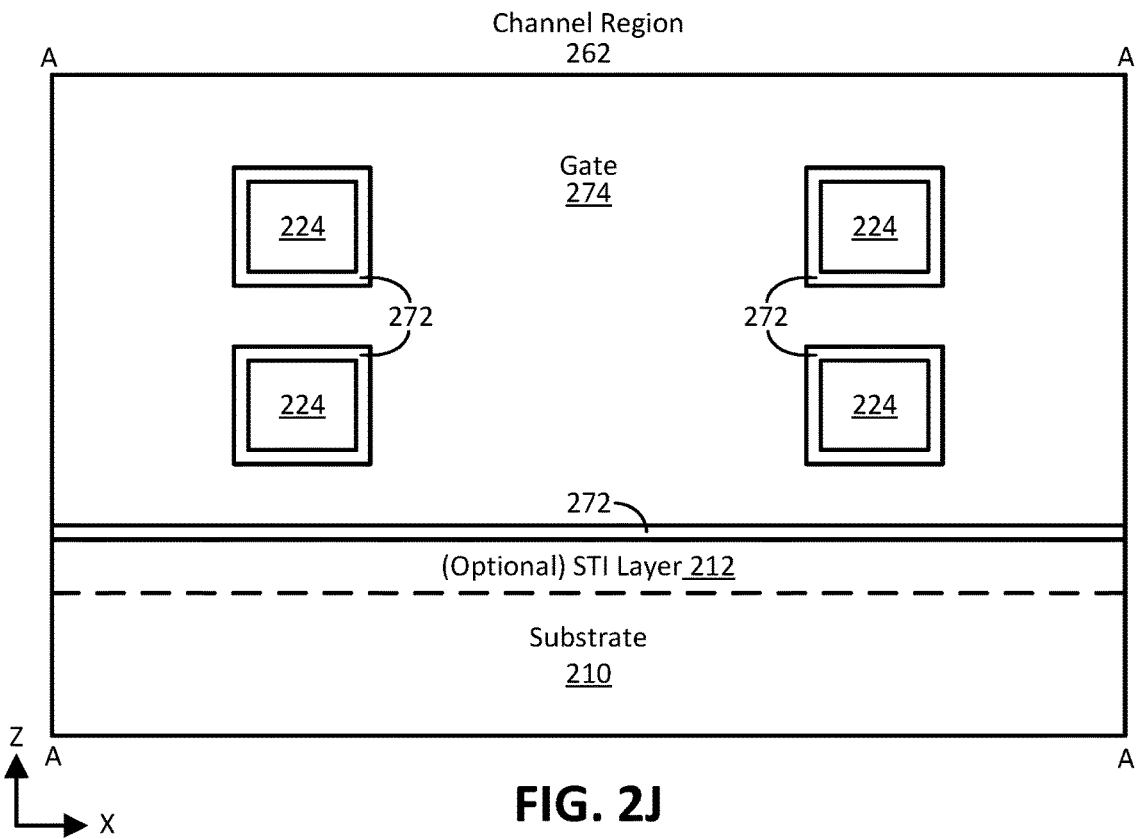

FIG. 2J illustrates an example resulting IC structure after gate (or gate electrode) 274 has been deposited in the exposed channel region 260 of the structure of FIG. 2I, in accordance with an embodiment. In some embodiments, gate 274 may be formed using any suitable techniques, such as using any suitable deposition process (e.g., MBE, CVD, ALD, PVD), for example. In some embodiments, gate (or gate electrode) 274 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate 274 may have a thickness in the range of 10-200 nm, for example, or some other suitable thickness as will be apparent in light of this disclosure. In some embodiments, gate dielectric layer 272 and/or gate 274 may include a multilayer structure of two or more material layers, for example. In some embodiments, gate dielectric layer 272 and/or gate 274 may include grading (e.g., increasing and/or decreasing) the content/concentration of one or more materials in at least a portion of the feature(s). Additional layers may be present in the final gate stack (e.g., in addition to gate dielectric layer 272 and gate 274), in some embodiments, such as one or more work function layers or other suitable layers, for example. As shown in the example embodiment of FIG. 2J, gate 274 (and the entire gate stack, in general) wraps completely or 100 percent around each nanowire 224. However, in some embodiments, the gate 274 may substantially wrap around each nanowire, such that it wraps around at least 60, 65, 70, 75, 80, 85, 90, 95, or 98 percent of each nanowire, for example, or some other suitable amount as will be apparent in light of this disclosure. As can also be understood based on this disclosure, in some embodiments, gate dielectric layer 274 may wrap around more of one or more nanowires in the channel region compared to gate 272, due to, for example, gate dielectric layer 272 occupying the space between nanowires and/or preventing gate 274 from forming in the space between nanowires, particularly when that space (having a minimum dimension D, shown in FIG. 2H) is relatively small (e.g., less than 5 nm). Note that after gate stack processing has been performed and gate 274 has been formed, the exposed channel region 260 is no longer exposed and has become channel region 262 in FIG. 2J.

Figure 2K:
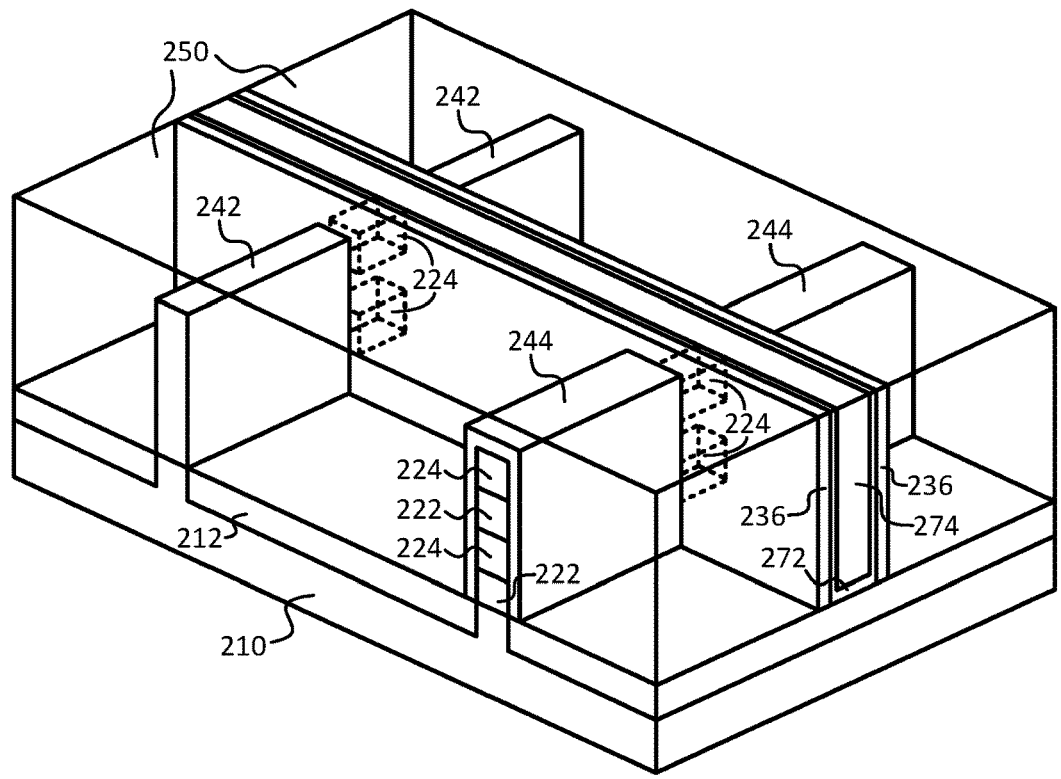

FIG. 2K illustrates a resulting example IC structure after the processing of FIGS. 2G-2J has been performed on the structure of FIG. 2F, in accordance with an embodiment. In other words, the structure of FIG. 2K is the same as the structure of FIG. 2J except that the view reverts back to the perspective view of the IC structure to illustrate subsequent processing, for example. Recall that the X, Y, and Z-axes are provided for all IC views to assist with orientation of the various figures. Also recall that in some embodiments, S/D processing may not occur until after the gate stack processing, such that S/D processing could be performed using the structure of FIG. 2K (if it had not yet been performed), for example.

Figure 2L:
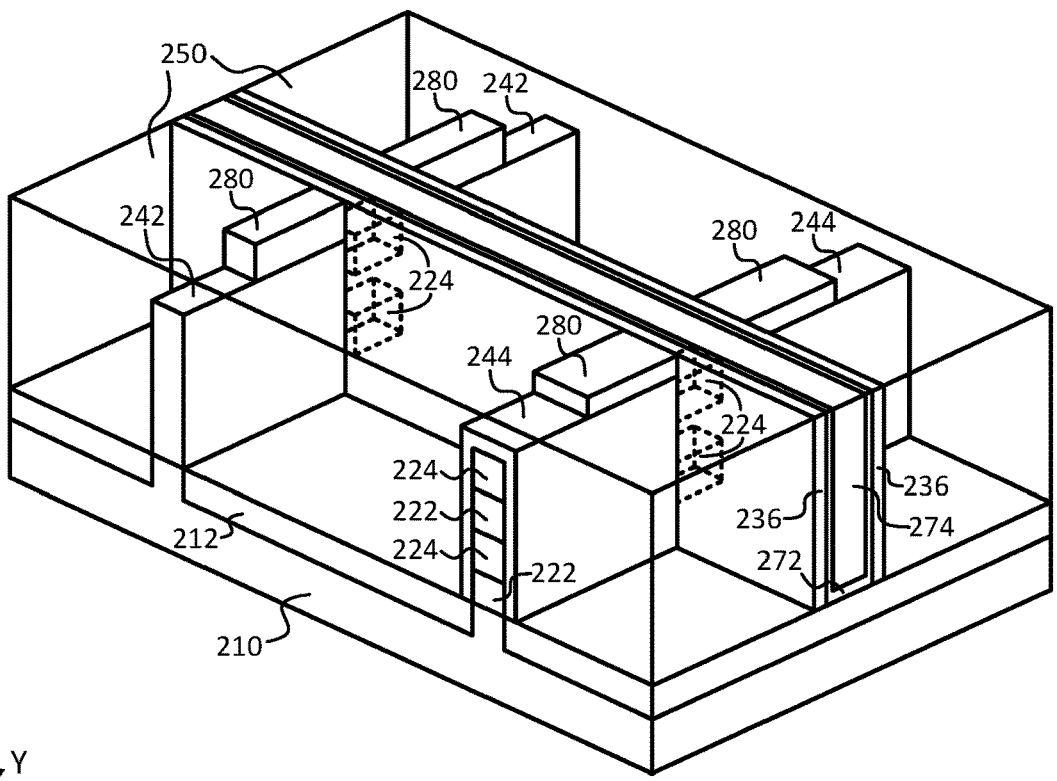

FIG. 2L illustrates a resulting example IC structure after forming S/D contacts 280 for the structure of FIG. 2K, in accordance with an embodiment. In some embodiments, S/D contacts 280 may be formed using any suitable techniques, such as forming contact trenches in the ILD layer 250 over the respective S/D regions and depositing metal or metal alloy (or other suitable electrically conductive material) in the trenches. In some embodiments, S/D contact 280 formation may include silicidation, germinidation, and/or annealing processes, for example. In some embodiments, S/D contacts 280 may include aluminum or tungsten, although any suitable conductive metal or alloy can be used, such as silver, nickel-platinum, or nickel-aluminum, for example. In some embodiments, one or more of the S/D contacts 280 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

Additional processing to complete the IC after S/D contact processing may include back-end or back-end-of-line (BEOL) processing to form one or more metallization layers and/or to interconnect the transistor devices formed, for example. Any other suitable processing may be performed, as will be apparent in light of this disclosure. Note that the techniques and resulting IC structures formed therefrom are presented in a particular order for ease of description. However, one or more of the processes may be performed in a different order or may not be performed at all. Recall that the techniques may be used to form one or more transistor devices including any of the following: field-effect transistors (FETs), metal-oxide-semiconductor FETs (MOSFETs), tunnel-FETs (TFETs), and/or nanowire (or nanoribbon or gate-all-around (GAA)) configuration transistors (having any number of nanowires/nanoribbons). In addition, the devices formed may include p-type transistor devices (e.g., PMOS) and/or n-type transistor devices (e.g., NMOS). Further, the transistor-based devices may include complementary MOS (CMOS) devices or quantum devices (few to single electron), to name a few examples. Numerous variations and configurations will be apparent in light of this disclosure.

Nanowire transistors can be formed by using a stack of alternating material layers where one of the sets of material layers in the stack is sacrificial or inactive. The stack of alternating material layers can be formed into fin-shaped stacks, where the sacrificial material layers in the fin stack are removed to form nanowires of the non-sacrificial material layers in the channel region of a transistor. Recall that nanowire transistors can be formed using a stack of alternating material layers where one set of the layers is intended to be sacrificial and the other set is intended to be non-sacrificial, such that the sacrificial layers can be removed via selective etch to leave the non-sacrificial layers to be used as nanowires in the channel region of the transistor. The stack can be formed, for example, in a blanket deposition process where the stack is then etched into multilayer fins, or alternatively by using aspect ratio trapping (ART) where fins native to a given substrate are recessed-and-replaced with multilayer fins having alternating non-sacrificial (active) layers and sacrificial (or otherwise inactive) layers.

Material Selection

As described above, nanowire transistor devices, as well as other configurations in which a semiconductor body is insulated from an underlying substrate, are prone to increased off-state leakage (also referred to as gate induced drain leakage). Embodiments herein include coordinated material selection for a semiconductor body and at least one of a source region and a drain region so that the material used for the semiconductor body is selected to have a band gap larger than the band gap of at least one of a source region and a drain region. In some embodiments the materials are selected such that there is an overlap in energies (or, in other words, no energy offset) between band energy levels of at least one of the source region, drain region relative to the semiconductor body for the majority charge carrier. In some cases, the materials are selected with a band offset in the band of the minority charge carrier in at least one of the drain region and the source region relative to the semiconductor body.

In other words, a wide band gap material is selected for the semiconductor body rather than for either of the source region or the drain region. This strategy for material selection is particularly advantageous for semiconductor devices having a semiconductor body width ("channel length") of 10 nm or less, which approaches the ballistic limit for charge carriers. For these channel lengths, charge carrier transport is limited by scattering events at the source and/or drain region/semiconductor body interface. Absent a scattering event at this interface, current in the device is a function of carrier injection velocity from the source region into the semiconductor body. Selecting a source region material (and optionally a drain region material) having a low band gap, a high carrier injection velocity, and a low effective mass enables the transistor device to maintain sufficient current despite using a wide band gap material for the semiconductor body even though wide band gap materials are generally considered to have a charge carrier mobility and charge carrier velocity that are inadequate for the channel region of the semiconductor body.

Figure 3A:
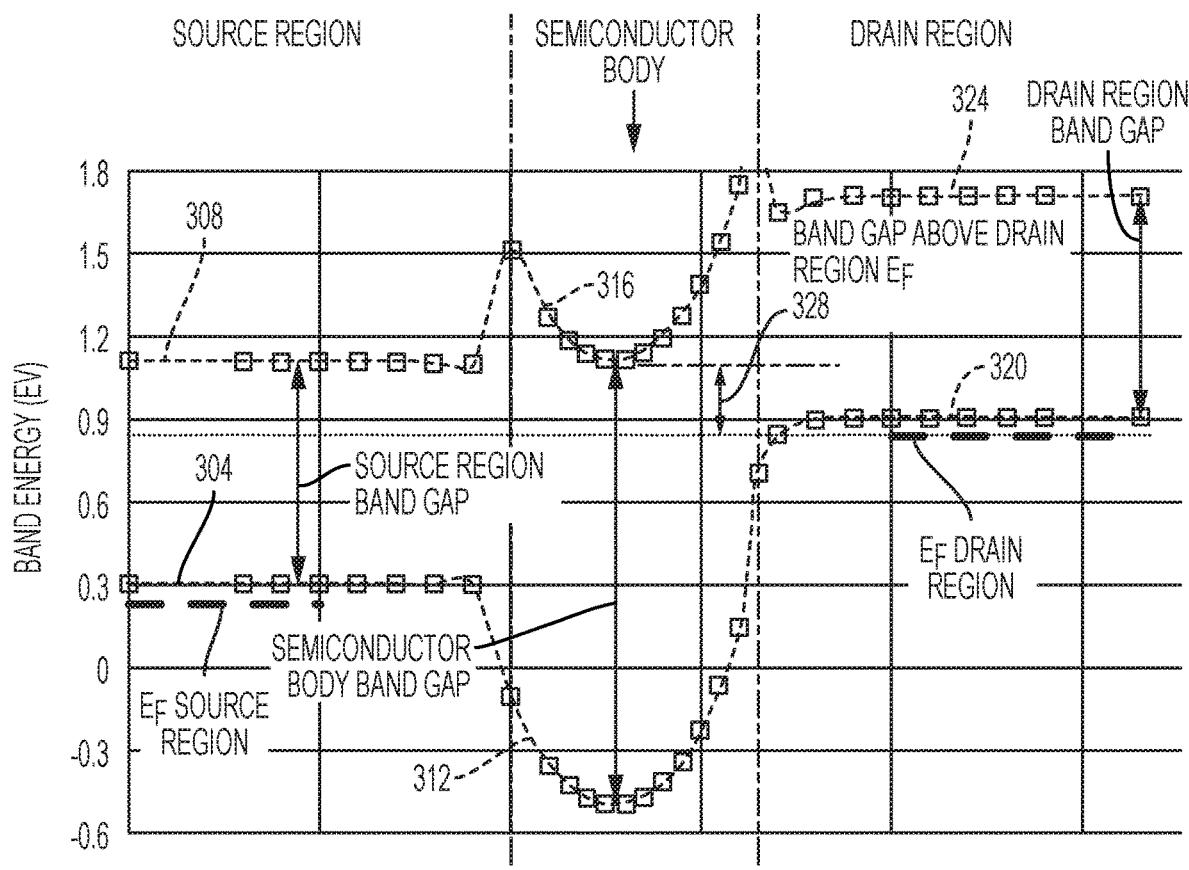
FIG. 3A is a graph of band energy levels for a source region, a drain region, and a semiconductor body therebetween where materials for the source region, the drain region, and the semiconductor body are selected to prevent band to band tunneling despite the occurrence of the floating body effect, in accordance with an embodiment of the present disclosure.
Figure 3B:
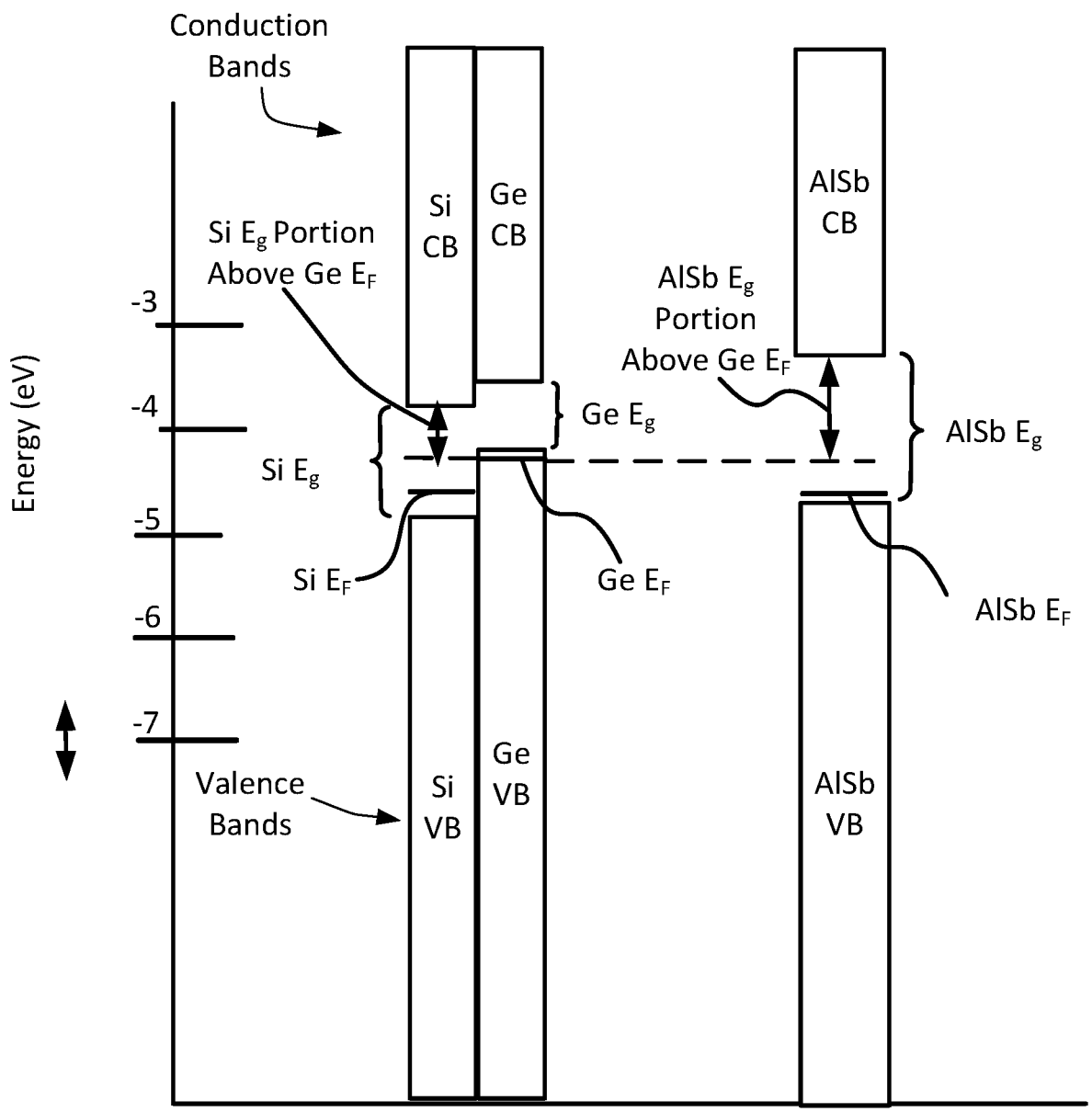
FIG. 3B is a graph illustrating an alternative view of the relationships of band energies and band gaps for silicon, germanium, and aluminum antimonide, in accordance with an embodiment of the present disclosure.

Example band energy and band gap structures are illustrated in FIGS. 3A and 3B. Turning first to FIG. 3A, the band energy diagram for a PFET device is illustrated. FIG. 3A illustrates source region valence band energy 304, source region conduction band energy 308, semiconductor body valence band energy 312, semiconductor body conduction band energy 316, drain region valence band energy 320, and drain region conduction band energy 324. A portion 328 of the band gap of the semiconductor body on the conduction band side of the drain region Fermi level prevents energetic overlap between the conduction band of the semiconductor body 316 and the valence band 320 of the drain region. This portion 328 of the band gap thus prevents charge carriers from tunneling from the semiconductor body conduction band 316 to the drain region valence band 320, thus preventing the BTBT effect and the off-state current leakage described above. However, because the band energies of the source region valence band 304, the semiconductor body balance band 312, and the drain region valence band 320 do overlap, flow of the majority carrier holes through the device is sufficient to support a current sufficient for device operation.

FIG. 3B illustrates an alternative view of the relationships of band energies and band gaps for silicon, germanium, and aluminum antimonide. In this depiction, the portion of the band gaps of these materials relative to the Fermi levels of these materials is shown to further illustrate the general selection criteria for materials, in embodiments of the present disclosure. For example, a PMOS device in which a source region and a drain region comprise germanium (Ge), and aluminum antimonide (AlSb) is selected for the semiconductor body, it can be seen that the band gap of the AlSb semiconductor body is greater than that of the Ge used for the source region and drain region. As shown, the $E_g$ of the AlSb semiconductor body overlaps the $E_F$ of the Ge source region and drain region. As described above, this prevents the BTBT effect, thus reducing $I_{OFF}$. Furthermore, upon inspection of FIG. 2B, it will apparent that a majority of the $E_g$ of the AlSb is on the conduction band side of the AlSb $E_f$. This configuration of band gap facilitates the flow of the majority carrier of holes through the various valence bands when the device is biased to the on-state. In this example, Ge Eg is 0.8 eV and AlSb Eg is 1.6 eV. A conduction band offset between the conduction bands of Ge and AlSb is 0.3 eV. A valence band offset between the valence bands of Ge and AlSb is 0.5 eV.

An alternative embodiment of a PMOS device can include Si as the semiconductor body material with Ge as the source region and drain region material. Analogous to the preceding example, a portion of the Si $E_g$ is above the Ge $E_f$ inhibiting the BTBT effect and thus reducing the $I_{OFF}$ needed to bias the device to an off-state. For the combination of materials in this alternative embodiment, an energetic barrier exists for charge carriers (in this case, holes) attempting to flow from the Ge source region into the Si semiconductor body.

Doping the Ge source region with a hole ("p+") dopant and doping the Si semiconductor body with an electron ("n−") dopant further increases this barrier. In some embodiments, this barrier can be managed and/or modified using by gate work-function engineering that reduces this energetic barrier to a level that the desired on-state current to off-state current ratio can be achieved.

While not illustrated in FIG. 3A, alternative material selections can be made for an NFET device is equally viable using an adaptation of the criteria above. A material having a larger band gap, with a majority of band gap associated with the valence band (in which majority charge carrier electrons are mobile) but little or no band offset in the conduction band can be selected for the semiconductor body. In one example, the semiconductor body can comprise indium phosphide (InP) and the drain region (and/or source region) can comprise indium gallium arsenide (InGaAs).

Example source region and drain region materials for a PMOS device include, for example, Ge. Example source region and drain region materials for an NMOS device include, for example InGaAs, InAs, among others, some of which are indicated in Table 1 with an InP semiconductor body. An alternative semiconductor body material for an NMOS device also includes AlSb with corresponding Ge source and drain regions. This particular example combination is interesting because of the magnitude of the band-gap in the AlSb semiconductor body (1.65 eV) compared to that in the Ge source/drain regions (0.67 eV). Also, in this example combination, the valence band of the source/drain regions has a 0.3 eV offset in the valence band and a 0.5 eV offset in the conduction band.

In another embodiment, Si can be used for a semiconductor body with Ge source and drain regions. This embodiment includes a valence band offset of 0.4 eV from Ge source and drain regions relative to the Si semiconductor body and a 0.05 eV band offset in the conduction band. Gate work-function engineering can be used to lift the bands up such that there is negligible impact to on-state current from these band offsets.

An additional factor that may be considered when determining coordinated material selection of source region, drain region, and semiconductor body is the disposition of charge carriers in "valleys" of Brillouin zones (also referred to as "k-space"). In some PMOS embodiments, charge carriers can be disposed within the "Gamma valley." In one PMOS example, when migrating between the semiconductor body, source region, and drain region, holes generally travel from a Gamma valley in the valence band of a source region (e.g., Ge) to a Gamma valley of the semiconductor body (e.g., AlSb or Si). This is also the case for many III-V materials. In another example, electrons in an NMOS device can be disposed within any of the Gamma valley, the X valley, or the L valley. Thus, when electrons travel between the source (or drain) region and the semiconductor body (e.g., from InGaAs source drain to InP semiconductor body), the carriers remain in the Gamma valley throughout. However, for some material combinations, this may not be the case because there may be a mismatch in conduction band valleys of the materials that inhibits electron flow. For example, for electron charge carriers, flow from Ge source region to a Si semiconductor body be difficult because the electrons must travel from an L valley (in the Ge source region) to an X valley (in the Si semiconductor body).

Alternative techniques can be employed to accomplish this effect even when material selections, on their own, are insufficient to accomplish the desired effect. For example, gate work function engineering can be used to mitigate increases resistance of a charge carrier traveling from a source region into a semiconductor body for which there is an unfavorable band offset so as to target a convention thermionic current to overcome the offset between source/drain region band(s) and semiconductor body band(s).

The following Table 1 identifies various example material systems that include combinations of drain region materials and semiconductor body materials, any of which can be applied in the context of embodiments of the present disclosure.

TABLE 1

Example Material Systems for NMOS and PMOS Devices

| MOS Type | Semiconductor Body Material (Band Gap eV) | Source Region/Drain Region Material (Band Gap eV) | Band Offset (eV) |
|---|---|---|---|
| NMOS | InP (1.34) | $In_{1-x}Ga_xAs$ $(0.36 + 0.63x + 0.43x^2)$ $In_{0.53}GaAs$ (0.74 eV) | 0 |
| NMOS | GaAs (1.43) | InAs (0.354) $In_{1-x}Ga_xAs$ $(0.36 + 0.63x + 0.43x^2)$ InGaAsSb (0.354 to 0.726) InSb (0.17) | 0 |
| NMOS | InGaP (1.4 to 2) | InAs (0.354) $In_{1-x}Ga_xAs$ $(0.36 + 0.63x + 0.43x^2)$ InGaAsSb (0.354 to 0.726) InSb (0.17) | 0 |
| NMOS | $Al_xGa_{1-x}As$ (1.4 to 2.168: $x < 0.45$: $1.424 + 1.247x$ eV $x > 0.45$: $1.9 + 0.125x + 0.143x^2$) | InAs (0.354) $In_{1-x}Ga_xAs$ $(0.36 + 0.63x + 0.43x^2)$ InGaAsSb (0.354 to 0.726) InSb (0.17) | 0 |
| NMOS | $In_xGa_{1-x}As_ySb_{1-y}$ (0.24 to 1.4) | InAs (0.354) InSb (0.17) | 0 |
| NMOS | $In_xGa_{1-x}P_ySb_{1-y}$ ($0 \leq x \leq 0.3$, $0 \leq y \leq 1$) (0.8 to 1.3) | InAs (0.354) $In_{1-x}Ga_xAs$ $(0.36 + 0.63x + 0.43x^2)$ InGaAsSb (0.354 to 0.726) InSb (0.17) | 0 |
| NMOS | AlGaSb (0.74 (GaSb) to 1.74 AlSb)) | InSb (0.17) GaSb (0.74) | 0 |
| PMOS | AlSb (1.4) | Ge (0.67) | 0.3 (VB) |
| PMOS | Si, $Si_xGe_{1-x}$ ($x \leq 0.5$) (0.67 to 1.2) | Ge (0.67) | At max 0.4 (VB) |

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including a transistor having a nanowire (or nanoribbon or gate-all-around (GAA)) configuration that includes the various material selections indicated above.

Example System

Figure 4:
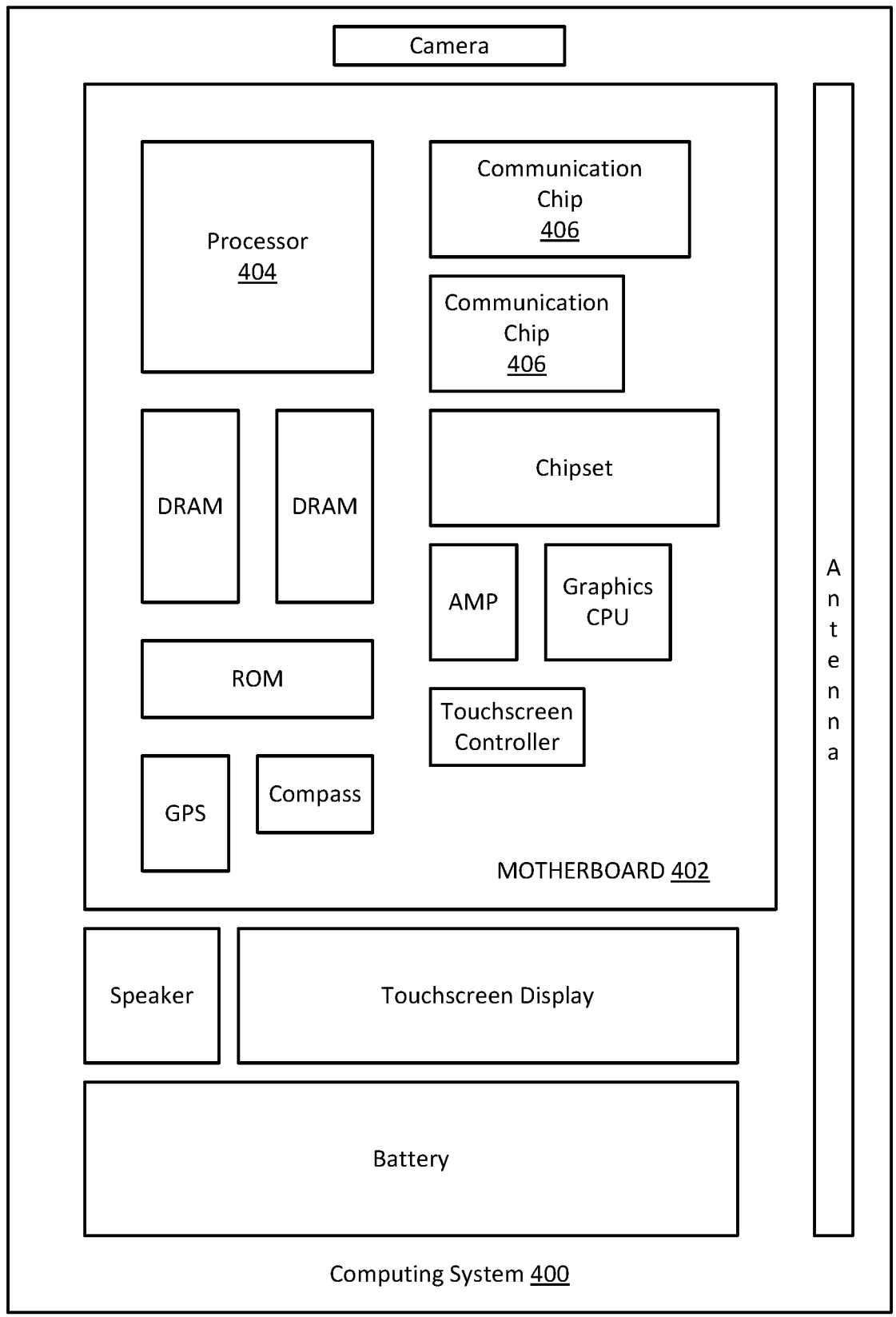
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a transistor device configured as variously described above.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising: a semiconductor body above a semiconductor substrate, the semiconductor body having a top surface and a bottom surface opposite the top surface that is proximate the substrate, the semiconductor body comprising a first material having a first band gap between a conduction band and a valence band of the first material; an insulation structure between the semiconductor substrate and the bottom surface of the semiconductor body; a gate structure including a gate dielectric structure on the semiconductor body, and including a gate electrode structure on the gate dielectric structure; and a source region and a drain region, the semiconductor body between the source region and the drain region, wherein at least one of the source region and the drain region comprises a second material having a second band gap between a conduction band and a valence band of the second material, the second band gap less than the first band gap of the semiconductor body.

Example 2 includes the subject matter of Example 1, wherein: the first band gap is greater than 1.3 eV; and the second band gap less than 0.75 eV.

Example 3 includes the subject matter of Example 1, wherein: the first band gap is from 1.3 eV to 2.2 eV; and the second band gap is from 0.15 eV to 0.75 eV.

Example 4 includes the subject matter of Example 1, wherein: the first band gap is from 0.67 eV to 1.3 eV; and the second band gap is less than 0.73 eV.

Example 5 includes the subject matter of Example 1, wherein: the first band gap is from 0.2 eV to 0.3 eV; and the second band gap is less than 0.2 eV.

Example 6 includes the subject matter of any of the preceding Examples, wherein the semiconductor body has a width of 10 nm or less.

Example 7 includes the subject matter of any of the preceding Examples, wherein: the source region, the drain region, and the semiconductor body comprise majority charge carriers having energies in one of the conduction band or the valence band; and further wherein the one of the conduction band or the valence band in which the majority charge carrier have energies is overlapping between the semiconductor body and at least one of the source region and the drain region.

Example 8 includes the subject matter of Example 7, wherein: the majority charge carriers are electrons; the conduction bands of the source region, the drain region, and the semiconductor body have at least some overlap in energies; and the valence band of the semiconductor body does not have any overlap in energy with at least one of the source region and the drain region.

Example 9 includes the subject matter of Example 7, wherein: the majority charge carriers are holes; the valence bands of the source region, the drain region, and the semiconductor body have at least some overlap in energies; and the conduction band of the semiconductor body does not have any overlap in energy with at least one of the source region and the drain region.

Example 10 includes the subject matter of any of Examples 1-8, wherein: the semiconductor body comprises indium and phosphorous; and at least one of the source region and the drain region comprises indium, and arsenic.

Example 11 includes the subject matter of Example 10, wherein: the semiconductor body further comprises gallium; and at least one of the source region and the drain region further comprises at least one of gallium and antimony.

Example 12 includes the subject matter of any of Examples 1-8, wherein: the semiconductor body comprises indium, gallium, arsenic, and antimony; and at least one of the source region and the drain region comprises indium and at least one of arsenic and antimony.

Example 13 includes the subject matter of any of Examples 1-8, wherein: the semiconductor body comprises indium, gallium, phosphorous, and antimony; and at least one of the source region and the drain region comprises indium and at least one of arsenic and antimony.

Example 14 includes the subject matter of Example 13, wherein at least one of the source region and the drain region further comprises gallium.

Example 15 includes the subject matter of any of Examples 1-8, wherein the semiconductor body comprises antimony and at least one of aluminum and gallium.

Example 16 includes the subject matter of Example 15, wherein at least one of the source region and the drain region comprises antimony and one of indium and gallium.

Example 17 includes the subject matter of Example 15, wherein at least one of the source region and the drain region comprises germanium.

Example 18 includes the subject matter of any of Examples 1-7 and Example 9, wherein: the semiconductor body comprises silicon; and at least one of the source region and the drain region comprises germanium.

Example 19 includes the subject matter of Example 18, wherein the semiconductor body further comprises germanium.

Example 20 includes the subject matter of any of the preceding Examples, wherein the semiconductor body comprises a nanowire.

Example 21 includes the subject matter of any of Examples 1-19, wherein the semiconductor body comprises a nanoribbon.

Example 22 includes the subject matter of any of the preceding Examples, comprising a semiconductor on insulator device.

Example 23 includes the subject matter of any of the preceding Examples, wherein a majority of the first band gap is above a Fermi level associated with an energy band of a majority charge carrier.

Example 24 includes the subject matter of any of Examples 1-8, Examples 10-16, and Examples 20-23, wherein: a majority charge carrier is an electron; the valence bands of the source region, the drain region, and the semiconductor body have an energy offset therebetween;

and the conduction bands of the source region, the drain region, and the semiconductor body do not have an energy offset therebetween.

Example 25 includes the subject matter of any of Examples 1-7, Example 9, and Examples 17-23, wherein: a majority charge carrier is a hole; the valence bands of the source region, the drain region, and the semiconductor body do not have an energy offset therebetween;

and the conduction bands of the source region, the drain region, and the semiconductor body have an energy offset therebetween.

Example 26 is a computing device comprising the integrated circuit device of any of the preceding Examples.

Example 27 is an integrated circuit device comprising: a semiconductor substrate; a semiconductor body above the semiconductor substrate, the semiconductor body having a top surface and a bottom surface opposite the top surface that is proximate the substrate, the semiconductor body comprising a first material having a first band gap between a conduction band and a valence band of the first material that is greater than 1.3 eV; an insulation structure between the semiconductor substrate and the bottom surface of the semiconductor body; a gate structure on at least the top surface of the semiconductor body, the gate structure including a gate dielectric structure on the top of the semiconductor body, and a gate electrode structure on the gate dielectric structure; and a source region and a drain region, the semiconductor body between the source region and the drain region, wherein at least one of the source region and the drain region comprises a second material having a second band gap between a conduction band and a valence band of the second material, the second band gap less than 0.75 eV.

Example 28 includes the subject matter of Example 27, wherein the semiconductor body is a nanowire encapsulated by the insulation layer.

Example 29 includes the subject matter of either of Examples 27 or 28, wherein the semiconductor body is a semiconductor on oxide device.

Example 30 includes the subject matter of any of Examples 27-29, wherein the semiconductor body has a width of 10 nm or less.

Example 31 includes the subject matter of any of Examples 27-30, wherein: majority charge carriers are electrons; the conduction bands of the source region, the drain region, and the semiconductor body have at least some overlap in energies; and the valence band of the semiconductor body does not have any overlap in energy with at least one of the source region and the drain region.

Example 32 includes the subject matter of any of Examples 27-30, wherein: majority charge carriers are holes; the valence bands of the source region, the drain region, and the semiconductor body have at least some overlap in energies; and the conduction band of the semiconductor body does not have any overlap in energy with the drain region.

Example 33 includes the subject matter of any of Examples 27-31, wherein: the semiconductor body comprises indium and phosphorous; and at least one of the source region and the drain region comprises indium, and arsenic.

Example 34 includes the subject matter Example 33, wherein: the semiconductor body further comprises gallium; and at least one of the source region and the drain region further comprises at least one of gallium and antimony.

Example 35 includes the subject matter of any of Examples 27-31, wherein: the semiconductor body comprises indium, gallium, arsenic, and antimony; and at least one of the source region and the drain region comprises indium and at least one of arsenic and antimony.

Example 36 includes the subject matter of any of Examples 27-31, wherein: the semiconductor body comprises indium, gallium, phosphorous, and antimony; and at least one of the source region and the drain region comprises indium and at least one of arsenic and antimony.

Example 37 includes the subject matter Example 36, wherein at least one of the source region and the drain region further comprises gallium.

Example 38 includes the subject matter of any of Examples 27-32, wherein the semiconductor body comprises antimony and at least one of aluminum and gallium.

Example 39 includes the subject matter Example 38, wherein at least one of the source region and the drain region comprises antimony and one of indium and gallium.

Example 40 includes the subject matter of any of Examples 27-30, and Example 32, wherein at least one of the source region and the drain region comprises germanium.

Example 41 includes the subject matter of any of Examples 27-30, 32, and 40, wherein: the semiconductor body comprises silicon; and at least one of the source region and the drain region comprises germanium.

Example 42 includes the subject matter of Example 41, wherein the semiconductor body further comprises germanium.

Example 43 includes the subject matter of any of Examples 27-31, 33-39, wherein: a majority charge carrier is an electron; the valence bands of the source region, the drain region, and the semiconductor body have an energy offset therebetween; and the conduction bands of the source region, the drain region, and the semiconductor body do not have an energy offset therebetween.

Example 44 includes the subject matter of any of Examples 27-30, 32, 41, 42, wherein: a majority charge carrier is a hole; the valence bands of the source region, the drain region, and the semiconductor body do not have an energy offset therebetween; and the conduction bands of the source region, the drain region, and the semiconductor body have an energy offset therebetween.

Example 45 is a computing device comprising the integrated circuit device of any of Examples 27-44.

Example 46 is an integrated circuit device comprising: a semiconductor substrate; a semiconductor body above the semiconductor substrate, the semiconductor body having a top surface and a bottom surface opposite the top surface that is proximate the substrate, the semiconductor body comprising a first material having a first band gap between a conduction band and a valence band of the first material that is greater than 0.67 eV; an insulation structure between the semiconductor substrate and the bottom surface of the semiconductor body; a gate structure on at least the top surface of the semiconductor body, the gate structure including a gate dielectric structure on the top of the semiconductor body, and a gate electrode structure on the gate dielectric structure; and a source region and a drain region, the semiconductor body between the source region and the drain region, wherein at least one of the source region and the drain region comprises a second material having a second band gap between a conduction band and a valence band of the second material, the second band gap less than 0.67 eV.

Example 47 includes the subject matter of Example 46, wherein: the first band gap of the first material is from 0.74 eV to 1.3 eV; and the second band gap of the second material is from 0.17 eV to 0.726 eV.

Example 48 includes the subject matter of Example 47, wherein the first material comprises indium, gallium, phosphorous, and antimony.

Example 49 includes the subject matter of Example 48, wherein the second material comprises indium and at least one of arsenic and antimony.

Example 50 includes the subject matter of Example 49, wherein the second material further comprises gallium.

Example 51 includes the subject matter of Example 46, wherein: the first band gap of the first material is from 0.67 eV to 1.2 eV; and the second band gap of the second material is 0.67 eV.

Example 52 includes the subject matter of Example 51, wherein: the first material comprises one of silicon and a silicon germanium alloy; and the second material comprises germanium Example 53 includes the subject matter of any of Examples 46-51, wherein: a majority charge carrier is an electron; the valence bands of the source region, the drain region, and the semiconductor body have an energy offset therebetween; and the conduction bands of the source region, the drain region, and the semiconductor body do not have an energy offset therebetween.

Example 54 includes the subject matter of any of Examples 46-50, 52, wherein: a majority charge carrier is a hole; the valence bands of the source region, the drain region, and the semiconductor body do not have an energy offset therebetween; and the conduction bands of the source region, the drain region, and the semiconductor body have an energy offset therebetween.

Example 55 is a computing device comprising the integrated circuit device of any of Examples 46-54.

Example 56 is an integrated circuit device comprising: a semiconductor substrate; a semiconductor body above the semiconductor substrate, the semiconductor body having a top surface and a bottom surface opposite the top surface that is proximate the substrate, the semiconductor body comprising a first material having a first band gap between a conduction band and a valence band of the first material that is greater than 0.2 eV; an insulation structure between the semiconductor substrate and the bottom surface of the semiconductor body; a gate structure on at least the top surface of the semiconductor body, the gate structure including a gate dielectric structure on the top of the semiconductor body, and a gate electrode structure on the gate dielectric structure; and a source region and a drain region, the semiconductor body between the source region and the drain region, wherein at least one of the source region and the drain region comprises a second material having a second band gap between a conduction band and a valence band of the second material, the second band gap less than 0.2 eV.

Example 57 includes the subject matter of Example 55, wherein: the first band gap is 0.24 eV; and the second band gap is 0.17 eV.

Example 58 includes the subject matter of either of Examples 55 or 56, wherein: the first material comprises indium, gallium, arsenic, and antimony; and the second material comprises indium and antimony.

Example 59 includes the subject matter of any of Examples 55-57, wherein: a majority charge carrier is an electron; the valence bands of the source region, the drain region, and the semiconductor body have an energy offset therebetween; and the conduction bands of the source region, the drain region, and the semiconductor body do not have an energy offset therebetween.

Example 60 includes the subject matter of any of Examples 55-58, wherein: a majority charge carrier is a hole; the valence bands of the source region, the drain region, and the semiconductor body do not have an energy offset therebetween; and the conduction bands of the source region, the drain region, and the semiconductor body have an energy offset therebetween.

Example 61 is a computing device comprising the integrated circuit device of any of Examples 55-60.

What is claimed is:

1. An integrated circuit device comprising:
a body above a substrate, the body having a top surface and a bottom surface opposite the top surface, the body comprising a first semiconductor material having a first band gap between a conduction band and a valence band of the first semiconductor material;
an insulation structure between the substrate and the bottom surface of the body;
a gate structure including a gate dielectric structure having a portion on the body and a portion on the insulation structure, wherein the portion of the gate dielectric structure on the insulation structure is continuous along the insulation structure beneath the bottom surface of the body, the gate structure further including a gate electrode structure on the gate dielectric structure, wherein the gate structure is completely wrapped around a channel region of the body; and
a source region and a drain region, the body between the source region and the drain region, wherein at least one of the source region and the drain region comprises a second semiconductor material having a second band gap between a conduction band and a valence band of the second semiconductor material, the second band gap less than the first band gap of the body, and wherein the insulation structure extends vertically beneath the source region and the drain region.

2. The integrated circuit device of claim 1, wherein: the first band gap is greater than 1.3 eV; and the second band gap less than 0.75 eV.

3. The integrated circuit device of claim 1, wherein: the first band gap is from 1.3 eV to 2.2 eV; and the second band gap is from 0.15 eV to 0.75 eV.

4. The integrated circuit device of claim 1, wherein: the first band gap is from 0.67 eV to 1.3 eV; and the second band gap is less than 0.73 eV.

5. The integrated circuit device of claim 1, wherein: the first band gap is from 0.2 eV to 0.3 eV; and the second band gap is less than 0.2 eV.

6. The integrated circuit device of claim 1, wherein the body has a width of 10 nm or less.

7. The integrated circuit device of claim 1, wherein: the source region, the drain region, and the body comprise majority charge carriers having energies in one of the conduction band or the valence band; and the one of the conduction band or the valence band in which the majority charge carrier have energies is overlapping between the body and at least one of the source region and the drain region.

8. The integrated circuit device of claim 7, wherein: the majority charge carriers are electrons; the conduction bands of the source region, the drain region, and the body have at least some overlap in energies; and the valence band of the body does not have any overlap in energy with at least one of the source region and the drain region.

9. The integrated circuit device of claim 7, wherein: the majority charge carriers are holes; the valence bands of the source region, the drain region, and the body have at least some overlap in energies; and the conduction band of the body does not have any overlap in energy with at least one of the source region and the drain region.

10. The integrated circuit device of claim 1, wherein: the body comprises indium and phosphorous; and at least one of the source region and the drain region comprises indium, and arsenic.

11. The integrated circuit device of claim 10, wherein: the body further comprises gallium; and at least one of the source region and the drain region further comprises at least one of gallium and antimony.

12. The integrated circuit device of claim 1, wherein: the body comprises indium, gallium, arsenic, and antimony; and at least one of the source region and the drain region comprises indium and at least one of arsenic and antimony.

13. The integrated circuit device of claim 1, wherein: the body comprises indium, gallium, phosphorous, and antimony; and at least one of the source region and the drain region comprises indium and at least one of arsenic and antimony.

14. The integrated circuit device of claim 13, wherein at least one of the source region and the drain region further comprises gallium.

15. The integrated circuit device of claim 1, wherein the body comprises antimony and at least one of aluminum and gallium.

16. The integrated circuit device of claim 15, wherein at least one of the source region and the drain region comprises antimony and one of indium and gallium.

17. The integrated circuit device of claim 15, wherein at least one of the source region and the drain region comprises germanium.

18. The integrated circuit device of claim 1, wherein: the body comprises one or both of silicon and germanium; and at least one of the source region and the drain region comprises germanium.

19. The integrated circuit device of claim 1, wherein a majority of the first band gap is above a Fermi level associated with an energy band of a majority charge carrier.

20. The integrated circuit device of claim 1, wherein: a majority charge carrier is an electron; the valence bands of the source region, the drain region, and the body have an energy offset therebetween; and the conduction bands of the source region, the drain region, and the body do not have an energy offset therebetween.

21. The integrated circuit device of claim 1, wherein:
a majority charge carrier is a hole;
the valence bands of the source region, the drain region, and the body do not have an energy offset therebetween; and
the conduction bands of the source region, the drain region, and the body have an energy offset therebetween.

22. An integrated circuit device comprising:
a nanowire comprising a first semiconductor material having a first band gap between a conduction band and a valence band of the first semiconductor material;
an insulation structure below the nanowire;
a gate structure completely wrapped around the nanowire, that gate structure including a gate dielectric structure having a portion on the nanowire and a portion on the insulation structure, wherein the portion of the gate dielectric structure on the insulation structure is continuous along the insulation structure beneath the nanowire, the gate structure further including a gate electrode structure on the gate dielectric structure; and
a source region and a drain region, the nanowire between the source region and the drain region, wherein at least one of the source region and the drain region comprises a second semiconductor material having a second band gap between a conduction band and a valence band of the second semiconductor material, the second band gap less than the first band gap of the nanowire, and wherein the insulation structure extends vertically beneath the source region and the drain region.

23. The integrated circuit device of claim 22, wherein the first semiconductor material comprises a group III-V semiconductor material, and the second semiconductor material comprises one or both of a group IV semiconductor material and a group III-V semiconductor material.

24. An integrated circuit device comprising:
a body having a top surface and a bottom surface opposite the top surface, the body comprising a first semiconductor material having a first band gap between a conduction band and a valence band of the first semiconductor material;
an insulation structure below the body;
a gate structure including a gate dielectric structure having a portion on the body and a portion on the insulation structure, wherein the portion of the gate dielectric structure on the insulation structure is continuous along the insulation structure beneath the body, the gate structure further including a gate electrode structure on the gate dielectric structure, wherein the gate structure is completely wrapped around a channel region of the body; and
a source region and a drain region, the body between the source region and the drain region, wherein at least one of the source region and the drain region comprises a second semiconductor material having a second band gap between a conduction band and a valence band of the second semiconductor material, the second band gap less than the first band gap of the body; wherein the first semiconductor material is indium phosphide which includes indium and phosphorus and the second semiconductor material is indium gallium arsenide which includes indium, gallium, and arsenic, or the first semiconductor material is aluminum antimonide which includes aluminum and antimony and the second semiconductor material includes germanium, and wherein the insulation structure extends vertically beneath the source region and the drain region.

25. The integrated circuit device of claim 24, wherein the body comprises one or more nanowires, and the gate structure wraps around the one or more nanowires to provide a gate all around structure.

* * * * *